United States Patent
Lu

(10) Patent No.: US 10,418,316 B1
(45) Date of Patent: Sep. 17, 2019

(54) SEMICONDUCTOR SUBSTRATE, SEMICONDUCTOR PACKAGE STRUCTURE AND METHOD OF MANUFACTURING A SEMICONDUCTOR DEVICE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/945,426

(22) Filed: Apr. 4, 2018

(51) Int. Cl.
| | |
|---|---|
| H01L 23/52 | (2006.01) |
| H01L 23/498 | (2006.01) |
| H01L 23/00 | (2006.01) |
| H01L 23/31 | (2006.01) |
| H01L 21/48 | (2006.01) |
| H01L 21/027 | (2006.01) |

(52) U.S. Cl.
CPC ...... *H01L 23/49838* (2013.01); *H01L 21/486* (2013.01); *H01L 23/3121* (2013.01); *H01L 23/49811* (2013.01); *H01L 23/49827* (2013.01); *H01L 23/49866* (2013.01); *H01L 24/16* (2013.01); *H01L 21/0273* (2013.01); *H01L 2224/16227* (2013.01); *H01L 2924/01022* (2013.01); *H01L 2924/01028* (2013.01); *H01L 2924/01079* (2013.01); *H01L 2924/15747* (2013.01); *H01L 2924/15763* (2013.01); *H01L 2924/3511* (2013.01)

(58) Field of Classification Search
CPC ............. H01L 21/486; H01L 23/49838; H01L 23/3121; H01L 23/49811; H01L 23/49827; H01L 23/49866; H01L 24/16

USPC .......................................................... 257/751
See application file for complete search history.

(56) References Cited

U.S. PATENT DOCUMENTS

| | | | | |
|---|---|---|---|---|
| 6,888,255 B2 * | 5/2005 | Murtuza | ........... | H01L 23/49811 228/180.22 |
| 7,462,514 B2 | 12/2008 | Shiroguchi et al. | | |
| 7,932,170 B1 * | 4/2011 | Huemoeller | ........ | H01L 21/4853 257/737 |
| 8,618,654 B2 * | 12/2013 | Sutardja | .................. | H01L 24/24 257/723 |
| 8,759,691 B2 * | 6/2014 | Ouchi | ................. | H01L 23/3192 174/250 |
| 9,392,703 B2 * | 7/2016 | Sanada | ................ | H05K 3/4007 |
| 2007/0085034 A1 | 4/2007 | Chang et al. | | |

FOREIGN PATENT DOCUMENTS

TW         I348077         9/2011

* cited by examiner

*Primary Examiner* — Luan C Thai
(74) *Attorney, Agent, or Firm* — Foley & Lardner LLP; Cliff Z. Liu

(57) ABSTRACT

A semiconductor substrate includes a first dielectric structure and a first circuit layer. The first circuit layer is embedded in the first dielectric structure. The first circuit layer does not protrude from a first surface of the first dielectric structure. The first circuit layer includes at least one conductive segment. The conductive segment includes a first portion adjacent to the first surface of the first dielectric structure and a second portion opposite to the first portion. A width of the first portion of the conductive segment is different from a width of the second portion of the conductive segment.

23 Claims, 20 Drawing Sheets

SEMICONDUCTOR SUBSTRATE, SEMICONDUCTOR PACKAGE STRUCTURE AND METHOD OF MANUFACTURING A SEMICONDUCTOR DEVICE

BACKGROUND

1. Field of the Disclosure

The present disclosure relates to the field of semiconductor substrates, semiconductor package structures and manufacturing processes, and more particularly, to an embedded trace substrate (ETS), semiconductor package structure including the same and manufacturing process for manufacturing the same semiconductor package structure and/or the same ETS.

2. Description of the Related Art

Along with the rapid development in electronics industry and the progress of semiconductor processing technologies, semiconductor chips are integrated with an increasing number of electronic components to achieve better electrical performance and more functions. Accordingly, the semiconductor chips are provided with more input/output (I/O) connections. To manufacture semiconductor packages including semiconductor chips with an increased number of I/O connections, sizes of the semiconductor chips and the semiconductor packages may correspondingly increase. Thus, a manufacturing cost may correspondingly increase. Alternatively, or additionally, to minimize sizes of semiconductor packages including semiconductor chips with an increased number of I/O connections, a bonding pad density of semiconductor substrates used for carrying the semiconductor chips may correspondingly increase. Thus, a line width/line space (L/S) of a circuit layer of the semiconductor substrate may decrease.

SUMMARY

In some embodiments, according to an aspect, a semiconductor substrate includes a first dielectric structure and a first circuit layer. The first circuit layer is embedded in the first dielectric structure. The first circuit layer does not protrude from a first surface of the first dielectric structure. The first circuit layer includes at least one conductive segment. The conductive segment includes a first portion adjacent to the first surface of the first dielectric structure and a second portion opposite to the first portion. A width of the first portion of the conductive segment is different from a width of the second portion of the conductive segment. An inclination angle between a side wall of the conductive segment and the first surface of the first dielectric structure may be greater than about 90 degrees.

In some embodiments, according to an aspect, a semiconductor package structure includes a semiconductor substrate and a semiconductor die. The semiconductor substrate includes a first dielectric structure and a first circuit layer. The first circuit layer is embedded in the first dielectric structure. The first circuit layer does not protrude from a first surface of the first dielectric structure. The first circuit layer includes at least one conductive segment. The conductive segment includes a first portion adjacent to the first surface of the first dielectric structure and a second portion opposite to the first portion. A width of the first portion of the conductive segment is different from a width of the second portion of the conductive segment. An inclination angle between a side wall of the conductive segment and the first surface of the first dielectric structure may be greater than about 90 degrees. A line width/line space (L/S) of the first circuit layer is less than or equal to about 2 μm/2 μm. The semiconductor die is attached to the semiconductor substrate and electrically connected to the first circuit layer.

In some embodiments, according to another aspect, a method of manufacturing a semiconductor device, includes: (a) providing a stacked structure, wherein the stacked structure comprises a first outermost layer, at least one intermediate layer and a second outermost layer, the second outermost layer is opposite to the first outermost layer, a reflective index of the stacked structure increases gradually from the first outermost layer though the at least one intermediate layer to the second outermost layer, and the second outermost layer is a photoresist layer; (b) emitting a light beam near the first outermost layer to pass through the first outermost layer and the intermediate layer to irradiate the second outermost layer; (c) developing the second outermost layer to form a plurality of openings; and (d) sputtering a metal structure in the openings of the second outermost layer to form a first circuit layer.

BRIEF DESCRIPTION OF THE DRAWINGS

Characteristics of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
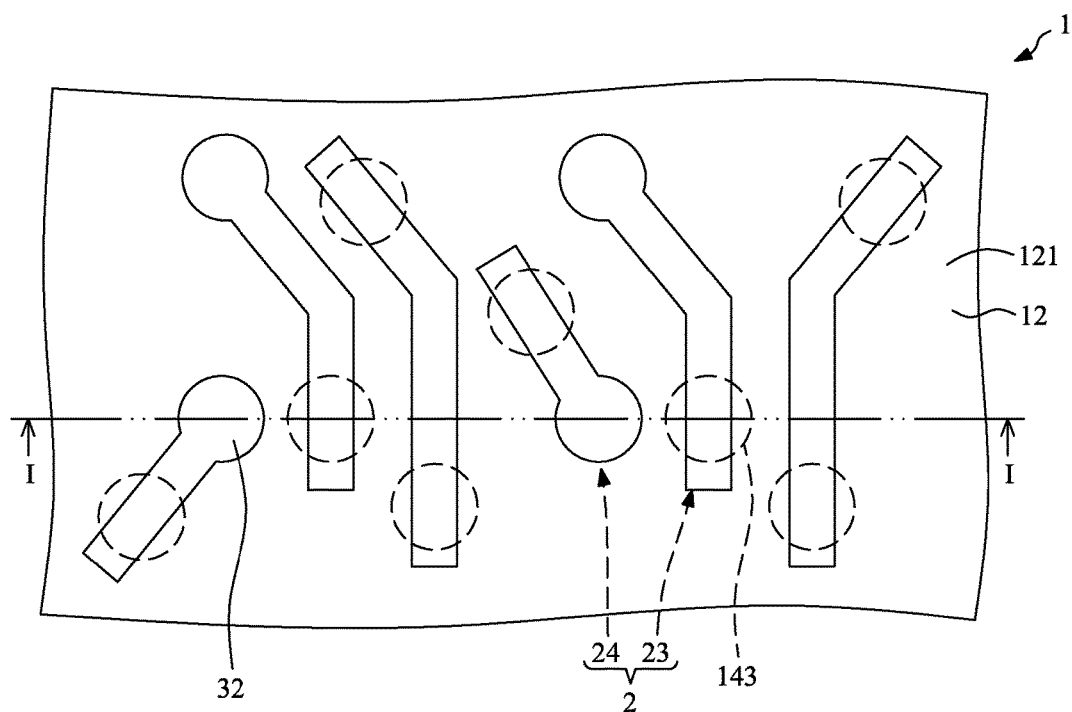
FIG. 1 illustrates a top view of an example of a portion of a semiconductor substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure are directed to a semiconductor substrate including a conductive segment that does not have a consistent width. A width of a first portion of the conductive segment is different from a width of a second portion of the conductive segment opposite to the first portion. At least some embodiments of the present disclosure are directed to techniques for manufacturing the semiconductor substrate.

In a comparative fan-out ETS, a line width/line space (L/S) of a fine-line circuit layer may be about 2 micrometers (μm)/about 2 μm, or about 3 μm/about 3 μm. A comparative process for manufacturing such ETS may include the following steps. A seed layer (e.g., copper (Cu) layer and/or titanium (Ti) layer) is disposed on a release layer of a carrier (e.g., silicon (Si) carrier or glass carrier). A photoresist layer is disposed on the seed layer and is patterned by, for example, exposure and development, to form a plurality of openings to expose one or more portions of the seed layer. It is noted that, during the exposure process, a light beam irradiates the photoresist layer directly through air that is in proximity to the photoresist layer. A conductive metal (e.g., Cu) is plated on the exposed portions of the seed layer in the openings of the photoresist layer. The photoresist layer is removed. Portions of the seed layer that are not covered by the conductive metal are removed by etching so as to form the fine-line circuit layer.

However, during the manufacturing process, a warpage may occur due to a mismatch of coefficients of thermal expansion (CTEs) between the carrier, the seed layer and the photoresist layer. That is, before the exposure step, the carrier, the seed layer and the photoresist layer may undergo at least one thermal process, and the amounts of deformation of the carrier, the seed layer and the photoresist layer caused by the thermal process are different. For example, the amount of deformation of the photoresist layer may be greater than the amount of deformation of the seed layer. Thus, it is difficult to control the sizes of the openings of the photoresist layer precisely during the exposure and development process because of the warpage. Accordingly, it is difficult to control the size of the fine-line circuit layer precisely. Therefore, the yield of the fine-line circuit layer can be less than 100%. The yield loss of the fine-line circuit layer can lead to defective final package structures, and increases the cost of such a fan-out process. Further, wet-processes, e.g., plating and etching, may further increase the cost of such a fan-out process. In addition, although a laser directing image (LDI) technology may be used in the exposure process, however, the L/S of the fine-line circuit layer cannot be reduced efficiently due to resolution limitation of the photoresist layer.

The present disclosure addresses at least the above concerns and provides an improved semiconductor substrate, and improved techniques for manufacturing the semiconductor substrate and/or ETS. In the manufacturing process, a stacked structure comprising a first outermost layer, at least one intermediate layer and a second outermost layer is disposed, wherein the second outermost layer is opposite to the first outermost layer. A reflective index of the stacked structure increases gradually from the first outermost layer to the second outermost layer. A light beam near the first outermost layer passes through the first outermost layer and the intermediate layer and irradiates the second outermost layer. The second outermost layer is developed to form a plurality of openings. A fine-line circuit layer is formed in the openings of the second outermost layer. Due to the gradually increased reflective index of the stacked structure, the exposure area of the light beam decreases as the light beam travels though the stacked structure and gets refracted on the boundaries between layers. Therefore, the second outermost layer can be precisely exposed and developed by the light beam of a small exposure area, and there is no need to use materials having different CTEs in various layers of the stacked structure. Features on the second outermost layer (including, e.g., photoresist) after exposure and development can achieve small sizes due to the decreased exposure area of the light beam. Thus, the CTE mismatch issue is reduced or eliminated, and the manufacturing process may control the sizes of the openings of the second outermost layer precisely. Accordingly, it is readily to control the size of the fine-line circuit layer precisely. Therefore, the yield of the fine-line circuit layer is improved efficiently. Further, no wet-processes, e.g., plating and etching, are conducted, which further reduce the cost of such fan-out process. In addition, a laser directing image (LDI) technology may be used in the exposure process.

Figure 2:
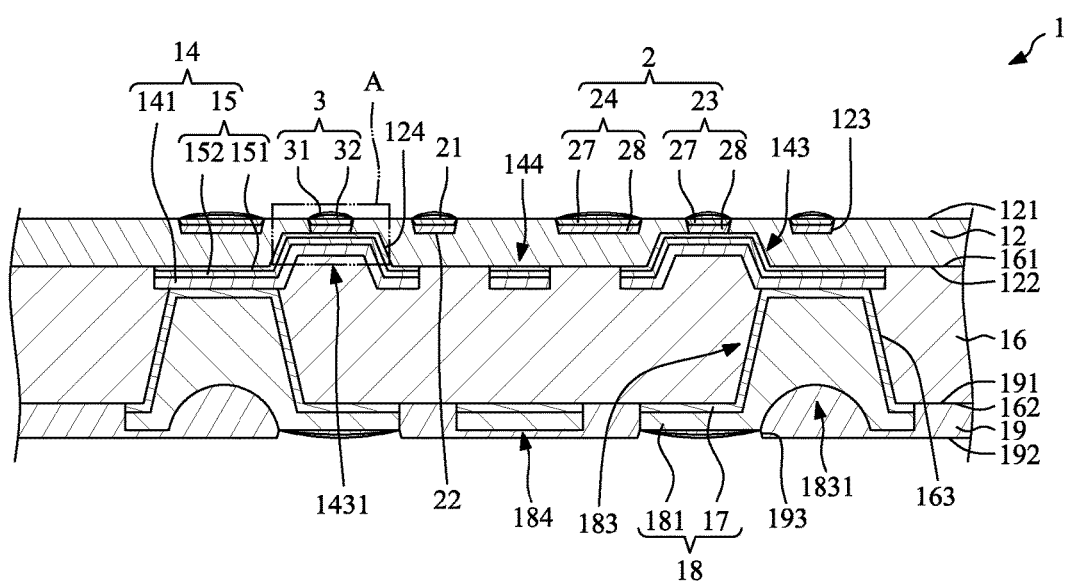
FIG. 2 illustrates a cross-sectional view of an example of a portion of the semiconductor substrate taken along a line I-I of FIG. 1.

FIG. 1 illustrates a top view of an example of a portion of a semiconductor substrate 1 according to some embodiments of the present disclosure. FIG. 2 illustrates a cross-sectional view of an example of a portion of the semiconductor substrate 1 taken along a line I-I of FIG. 1. The semiconductor substrate 1 may be a fan-out ETS, and includes a first dielectric structure 12, a first circuit layer 2, a barrier layer 3, a second circuit layer 14, a plurality of second conductive vias 143, a second dielectric structure 16, a third circuit layer 18, a plurality of third conductive vias 183 and a third dielectric structure 19.

The first dielectric structure 12 may be a passivation layer, and may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. In one or more embodiments, the first dielectric structure 12 may include, or be formed from, a dry film type material that includes a resin and a plurality of fillers. In another embodiment, the first dielectric structure 12 may include, or be formed from, a liquid type material that includes a homogeneous resin without fillers. In some embodiments, the material of the first dielectric structure 12 may include inorganic material (e.g., $SiO_x$, $SiN_x$, $TaO_x$), a glass, silicon, a ceramic, or a combination of two or more thereof. As shown in FIG. 1, the first dielectric structure 12 may have a first surface 121 and a second surface 122 opposite to the first surface 121. As shown in FIG. 2, the first dielectric structure 12 may define a plurality of recess portions 123 and a plurality of openings 124. The recess portions 123 are recessed from the first surface 121 of the first dielectric structure 12, and do not extend through the first dielectric structure 12. The openings 124 are recessed from the second surface 122 of the first dielectric structure 12, and do not extend through the first dielectric structure 12. Positions of the openings 124 correspond to positions of at least some of the recess portions 123. For example, the openings 124 may be disposed underneath at least some of the recess portions 123. In one embodiment, a thickness of the first dielectric structure 12 may be in a range of about 5 μm to about 10 μm, about 2 μm to about 20 μm, about 1 μm to about 50 μm, or about 0.5 μm to about 100 μm.

The first circuit layer 2 is embedded in the first dielectric structure 12, and includes a first surface 21 and a second surface 22 opposite to the first surface 21. The first circuit layer 2 is disposed in the recess portions 123 of the first dielectric structure 12, and does not protrude from the first surface 121 of the first dielectric structure 12. Some portion(s) (e.g., the first surface 21) of the first circuit layer 2 is exposed from the first surface 121 of the first dielectric structure 12. For example, the first dielectric structure 12 does not cover the first surface 21 of the first circuit layer 2. In addition, some portion(s) (e.g., the second surface 22) of the first circuit layer 2 may be exposed from the openings 124 of the first dielectric structure 12. As shown in FIG. 2, the first surface 21 of the first circuit layer 2 is substantially coplanar with the first surface 121 of the first dielectric structure 12. However, in some embodiments, the first surface 21 of the first circuit layer 2 may be recessed from the first surface 121 of the first dielectric structure 12.

The first circuit layer 2 may include at least one conductive segment. As shown in FIG. 1 and FIG. 2, the first circuit layer 2 may include a plurality of conductive segments. The conductive segments may include, for example, a plurality of conductive traces 23 and/or a plurality of bonding pads 24. In one or more embodiments, a line width/line space (L/S) of the first circuit layer 2 may be equal to or less than about 2 μm/about 2 μm (such as, for example, about 1.8 μm/about 1.8 μm or less, about 1.6 μm/about 1.6 μm or less, or about 1.4 μm/about 1.4 μm or less), equal to or less than about 1 µm/about 1 µm, or equal to or less than about 0.5 µm/about 0.5 µm. Further, a surface roughness value (e.g., in terms of root mean square surface roughness) of the first surface 21 of the first circuit layer 2 may be in a range of from about 5 nanometers (nm) to about 55 nm, from about 2 nm to about 80 nm, or from about 1 nm to about 100 nm.

As shown in FIG. 2, each or at least one conductive segment (e.g., the conductive trace 23 or the bonding pad 24) of the first circuit layer 2 includes a first metal structure 27 and a second metal structure 28. The second metal structure 28 is disposed on the first metal structure 27. In some embodiments, a material of the first metal structure 27 is titanium (Ti), and a material of the second metal structure 28 is copper (Cu). A thickness of the first metal structure 27 may be greater than or equal to about 0.1 µm, and a thickness of the second metal structure 28 may be greater than or equal to about 0.2 µm. In some embodiments, the thickness of the first metal structure 27 may be in a range of about 0.1 µm to about 0.2 µm, about 0.05 µm to about 0.25 µm, or about 0.02 µm to about 0.28 µm; and the thickness of the second metal structure 28 may be in a range of about 0.2 µm to about 0.3 µm, about 0.15 µm to about 0.35 µm, or about 0.12 µm to about 0.38 µm.

The barrier layer 3 is disposed on one or more conductive segments (e.g., the conductive trace 23 and/or the bonding pad 24) of the first circuit layer 2. In some embodiments, the barrier layer 3 includes a nickel layer 31 and a gold layer 32. The nickel layer 31 is disposed on the conductive segment(s) (e.g., the conductive trace 23 and/or the bonding pad 24), and the gold layer 32 is disposed on the nickel layer 31. Thus, the nickel layer 31 is disposed between the gold layer 32 and the conductive segment(s) (e.g., the conductive trace 23 and/or the bonding pad 24). In some embodiments, a surface roughness value of a first surface 311 of the nickel layer 31 is in a range of about 200 nm to about 300 nm, and a surface roughness value of a first surface 321 of the gold layer 32 is in a range of about 50 nm to about 200 nm. In some other embodiments, materials of the layer 31 and the layer 32 may include conductive materials other than nickel or gold.

The second circuit layer 14 is disposed on the conductive trace 23 of the first circuit layer 2 in the opening 124 of the first dielectric structure 12 and on the second surface 122 of the first dielectric structure 12. In some embodiments, a portion of the second circuit layer 14 is disposed in the opening 124 of the first dielectric structure 12 so to form at least one second conductive via 143, and the other portion of the second circuit layer 14 is disposed on the second surface 122 of the first dielectric structure 12 so as to form a second patterned layer 144 which may include at least one conductive trace and/or at least one bonding pad. The second conductive via 143 is electrically connected to and contacts the conductive trace 23 of the first circuit layer 2. Thus, the second circuit layer 14 is electrically connected to the first circuit layer 2 through the second conductive via 143.

The second conductive via 143 may be a tapered structure that is tapered from the second surface 122 of the first dielectric structure 12 toward the first surface 121 of the first dielectric structure 12. The second conductive via 143 may define a central hole 1431. The second conductive via 143 and the second patterned layer 144 may be formed integrally and concurrently. An L/S of the second circuit layer 14 may be less than, for example, about 7 µm/about 7 µm, about 5 µm/about 5 µm, or about 2 µm/about 2 µm. The L/S of the second circuit layer 14 may be greater than the L/S of the first circuit layer 2.

As shown in FIG. 2, the second circuit layer 14 includes a second seed layer 15 and a second metal layer 141. The second seed layer 15 is disposed on and contacts the conductive trace 23 of the first circuit layer 2 in the opening 124 of the first dielectric structure 12, and is disposed on and contacts the second surface 122 of the first dielectric structure 12. The second metal layer 141 is disposed on the second seed layer 15. In some embodiments, the second seed layer 15 may have a two-layered structure (or multi-layered structure), and may include a first layer 151 and a second layer 152. The material of the first layer 151 may be titanium (Ti), the material of the second layer 152 may be copper (Cu), and the material of the second metal layer 141 may be copper (Cu). It is noted that the second conductive via 143 may include at least a portion of the second seed layer 15 and the second metal layer 141, and the second patterned layer 144 may include at least a portion of the second seed layer 15 and the second metal layer 141.

The second dielectric structure 16 may be a dielectric layer which may be, or may include, for example, a monocrystalline silicon, a polycrystalline silicon, an amorphous silicon, other suitable materials, or a combination thereof. The second dielectric structure 16 may be, or may include, for example, a sheet made from pre-impregnated composite fibers. For example, the second dielectric structure 16 may include a cured fiber reinforced resin. It is noted that the second dielectric structure 16 may include, or be formed from, a cured PID material such as epoxy or PI including photoinitiators. A material of the second dielectric structure 16 may be the same as or different from a material of the first dielectric structure 12. A thickness of the second dielectric structure 16 may be, for example, about 50 µm to about 100 µm, about 30 µm to about 120 µm, or about 10 µm to about 150 µm.

The second dielectric structure 16 includes a first surface 161 and a second surface 162 opposite to the first surface 161. The second dielectric structure 16 covers the second circuit layer 14 and the second surface 122 of the first dielectric structure 12. Thus, the first surface 161 of the second dielectric structure 16 contacts the second surface 122 of the first dielectric structure 12, and at least a portion of the second dielectric structure 16 extends into the central hole 1431 of the second conductive via 143 of the second circuit layer 14. In addition, the second dielectric structure 16 defines a plurality of openings 163 to expose portions of the second circuit layer 14 (e.g., portions corresponding to the second metal layer 141). The openings 163 of the second dielectric structure 16 may extend through the second dielectric structure 16.

The third circuit layer 18 is disposed on the exposed portions of the second circuit layer 14 in the openings 163 of the second dielectric structure 16 and on the second surface 162 of the second dielectric structure 16. In some embodiments, a portion of the third circuit layer 18 is disposed in the opening 163 of the second dielectric structure 16 so to form at least one third conductive via 183, and the other portion of the third circuit layer 18 is disposed on the second surface 162 of the second dielectric structure 16 so as to form a third patterned layer 184 which may include at least one conductive trace and/or at least one bonding pad. The third conductive via 183 is electrically connected to and contacts the second circuit layer 14. Thus, the third circuit layer 18 is electrically connected to the second circuit layer 14 through the third conductive via(s) 183.

The third conductive via 183 may be a tapered structure that is tapered from the second surface 162 of the second dielectric structure 16 toward the first surface 161 of the second dielectric structure 16. The third conductive via 183 may define a recess portion 1831 at a bottom end thereof. The third conductive via(s) 183 and the third patterned layer 184 may be formed integrally and concurrently. An L/S of the third circuit layer 18 may be greater than, for example, about 5 µm/about 5 µm, about 7 µm/about 7 µm, or about 10 µm/about 10 µm. The L/S of the third circuit layer 18 may be greater than the L/S of the second circuit layer 14.

As shown in FIG. 2, the third circuit layer 18 may include a third seed layer 17 and a third metal layer 181. The third seed layer 17 is disposed on and contacts the exposed portions of the second circuit layer 14 in the openings 163 of the second dielectric structure 16, and is disposed on and contacts the second surface 162 of the second dielectric structure 16. The third metal layer 181 is disposed on the third seed layer 17. In some embodiments, the third seed layer 17 may be a single-layered or two-layered structure (or multi-layered structure). For example, the third seed layer 17 may include a titanium (Ti) layer and a copper (Cu) layer. It is noted that the third conductive via 183 may include at least a portion of the third seed layer 17 and the third metal layer 181, and the third patterned layer 184 may include at least a portion of the third seed layer 17 and the third metal layer 181. In some other embodiments, materials of the layer 17 may include conductive materials other than titanium or copper.

The third dielectric structure 19 may be a passivation layer, and may include, or be formed from, a photoresist layer, a cured photosensitive material, a cured PID material such as a PA, an ABF, a BT, a PI, epoxy or PBO, or a combination of two or more thereof. In one or more embodiments, the third dielectric structure 19 may include, or be formed from, a dry film type material that includes a resin and a plurality of fillers. In another embodiment, the third dielectric structure 19 may include, or be formed from, a liquid type material that includes a homogeneous resin without fillers. In some embodiments, the material of the third dielectric structure 19 may include inorganic material (e.g., $SiO_x$, $SiN_x$, $TaO_x$), a glass, a silicon, a ceramic, or a combination of two or more thereof. A material of the third dielectric structure 19 may be the same as or different from a material of the first dielectric structure 12. A thickness of the third dielectric structure 19 may be, for example, about 5 µm to about 10 µm, about 3 µm to about 12 µm, or about 1 µm to about 15 µm.

The third dielectric structure 19 includes a first surface 191 and a second surface 192 opposite to the first surface 191. The third dielectric structure 19 covers the third circuit layer 18 and the second surface 162 of the second dielectric structure 16. Thus, the first surface 191 of the third dielectric structure 19 contacts the second surface 162 of the second dielectric structure 16. A portion of the third dielectric structure 19 extends into the recess portion 1831 of the third conductive via 183 of the third circuit layer 18. In addition, the third dielectric structure 19 defines a plurality of openings 193 to expose portions of the third circuit layer 18 (e.g., portions corresponding to the third metal layer 181).

In some embodiments, the barrier layer 3 may be further disposed on the exposed portions of the third circuit layer 18 (e.g., portions corresponding to the third metal layer 181) in the openings 193 of the third dielectric structure 19 (not shown in FIG. 2). The nickel layer 31 is disposed on the exposed portions of the third circuit layer 18, and the gold layer 32 is disposed on the nickel layer 31. Thus, the nickel layer 31 is disposed between the gold layer 32 and the third circuit layer 18.

Figure 3:
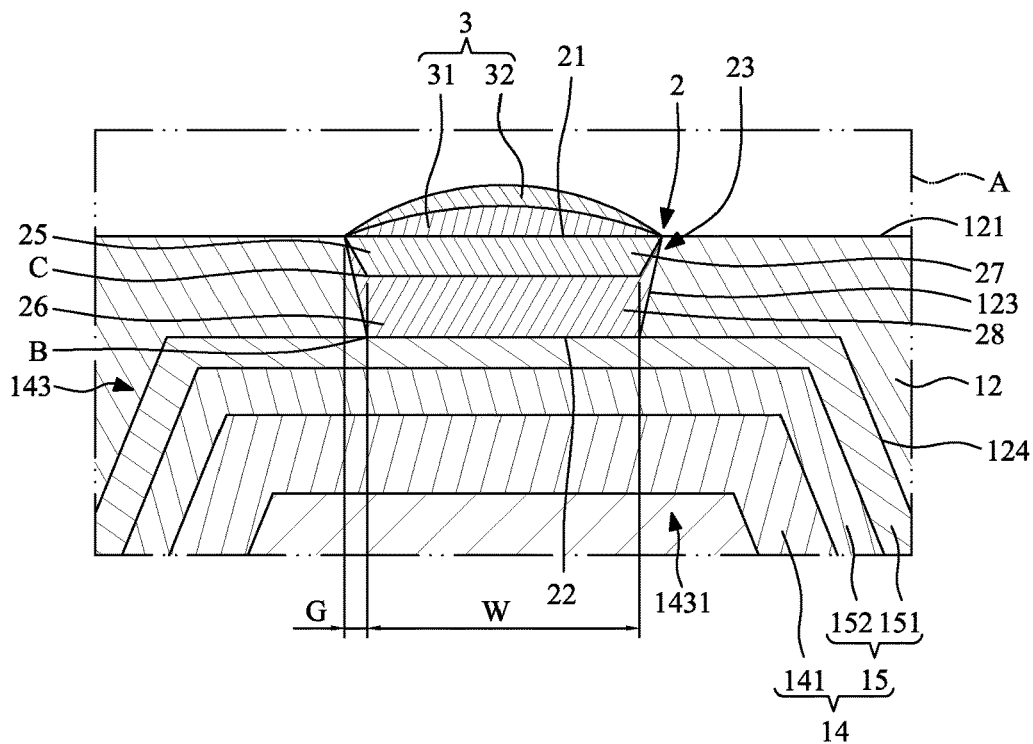
FIG. 3 illustrates an enlarged view of an area "A" in FIG. 2.

FIG. 3 illustrates an enlarged view of an area "A" in FIG. 2. The conductive segment (e.g., the conductive trace 23 or the bonding pad 24) includes a first portion 25 (e.g., a first end) and a second portion 26 (e.g., a second end). The first portion 25 is close to or disposed adjacent to the first surface 121 of the first dielectric structure 12, and the second portion 26 is opposite to the first portion 25. That is, the second portion 26 is farther away from the first surface 121 of the first dielectric structure 12, compared to the first portion 25. A width of the first portion 25 of the conductive segment (e.g., the conductive trace 23 or the bonding pad 24) may be different from a width of the second portion 26 of the conductive segment (e.g., the conductive trace 23 or the bonding pad 24).

As shown in FIG. 3, the width of the first portion 25 of the conductive segment adjacent to the first surface 21 (e.g., the conductive trace 23 or the bonding pad 24) may be greater than the width of the second portion 26 of the conductive segment adjacent to the second surface 22 (e.g., the conductive trace 23 or the bonding pad 24), for example, about 1.05 times or greater, about 1.1 times or greater, or about 1.2 times or greater. The conductive segment (e.g., the conductive trace 23 or the bonding pad 24) is tapered from the first surface 21 to the second surface 22. The conductive segment (e.g., the conductive trace 23 or the bonding pad 24) may be in an inverse trapezoid shape. In other words, the conductive segment (e.g., the conductive trace 23 or the bonding pad 24) is tapered from the first surface 121 of the first dielectric structure 12 toward the second surface 122 of the first dielectric structure 12. An inclination angle between the side wall of the conductive segment (e.g., the conductive trace 23 or the bonding pad 24) and the first surface 121 of the first dielectric structure 12 may be greater than about 90 degrees, about 95 degrees or greater, or about 100 degrees or greater.

As shown in FIG. 2 and FIG. 3, the second conductive via 143 is tapered in a direction opposite to the direction in which the conductive segment (e.g., the conductive trace 23 and the bonding pad 24) of the first circuit layer 2 is tapered. For example, the second conductive via 143 is an upward tapered structure (e.g., tapered from the second surface 122 of the first dielectric structure 12 toward the first surface 121 of the first dielectric structure 12), and the conductive segment (e.g., the conductive trace 23 and the bonding pad 24) of the first circuit layer 2 is a downward tapered structure (e.g., tapered from the first surface 121 of the first dielectric structure 12 toward the second surface 122 of the first dielectric structure 12).

In addition, the first metal structure 27 may be in an inverse trapezoid shape. That is, a width of an upper portion of the first metal structure 27 is greater than a width of the lower portion of the first metal structure 27. The first metal structure 27 is tapered from its top surface to its bottom surface. Further, the second metal structure 28 further extends to cover and contacts at least a portion of a side surface of the first metal structure 27. Thus, the second metal structure 28 defines a cavity corresponding to the first metal structure 27, and the second metal structure 28 is in, e.g., a bowl shape or an inverse cap shape. The width of the second surface 22 is defined as "W", the leftmost point of the second surface 22 is defined as "B", and the leftmost point of the first surface 21 is defined as "C". The gap between the point B and the point C is defined as "G", and G is from 0% to about 5% of W, from 0% to about 10% of W, or from 0% to about 15% of W. Thus, the difference between the width of the first surface 21 and the width W of the second surface 22 is from 0% to about 10% of W, from 0% to about 20% of W, or from 0% to about 30% of W.

In the embodiments illustrated in FIGS. 1-3, the shapes and the sizes of the conductive segment(s) (e.g., the conductive trace 23 and/or the bonding pad 24) of the first circuit layer 2 are specified by the manufacturing process as stated below. In the manufacturing process, a light beam is provided to pass through a stacked structure with a gradually increasing reflective index. Thus, the CTE mismatch issue is reduced or eliminated, and the technology may be used to control the sizes of the openings of a photoresist layer precisely in the exposure step and/or the development step. Accordingly, the technology may be used to control the size of the first circuit layer 2 precisely formed in the openings of the photoresist layer. Therefore, the L/S of the first circuit layer 2 may be reduced, and the yield of the first circuit layer 2 may be improved efficiently.

Figure 4:
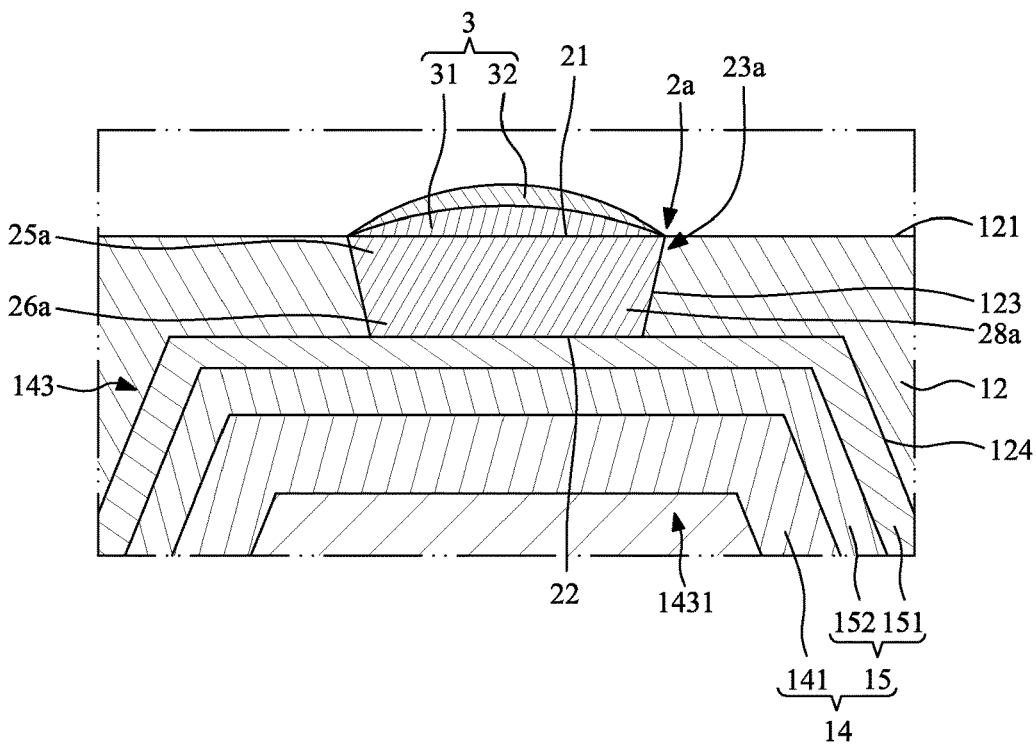
FIG. 4 illustrates an enlarged view of an area of a cross-sectional view of an example of a portion of a first circuit layer according to some embodiments of the present disclosure.

FIG. 4 illustrates an enlarged view of an area of a cross-sectional view of an example of a portion of a first circuit layer 2a according to some embodiments of the present disclosure. The first circuit layer 2a of FIG. 4 is similar to the first circuit layer 2 as shown in FIGS. 1-3, except that the conductive segment (e.g., the conductive trace 23a and/or the bonding pad) of the first circuit layer 2a is a monolithic structure rather than a double-layered structure. As shown in FIG. 4, the conductive segment (e.g., the conductive trace 23a and/or the bonding pad) of the first circuit layer 2a includes a second metal structure 28a which may be, e.g., copper (Cu) (or another suitable conductive material). That is, the second metal structure 28a may be a single layer, and may substantially fill the recess portions 123 of the first dielectric structure 12.

The conductive segment (e.g., the conductive trace 23a and/or the bonding pad 24) may include a first portion 25a and a second portion 26a. The first portion 25a is close to or disposed adjacent to the first surface 121 of the first dielectric structure 12, and the second portion 26a is opposite to the first portion 25a. Because the first circuit layer 2a is a monolithic structure, the first portion 25a and the second portion 26a may be formed from the same material (e.g., Cu), and may be formed integrally and concurrently. A width of the first portion 25a of the conductive segment (e.g., the conductive trace 23a and/or the bonding pad) is greater than a width of the second portion 26a of the conductive segment (e.g., the conductive trace 23a and/or the bonding pad). Thus, a width of the first portion 25a of the second metal structure 28a is greater than a width of the second portion 26a of the second metal structure 28a. The top surface of the second metal structure 28a is the first surface 21 of the conductive segment (e.g., the conductive trace 23a or the bonding pad). A surface roughness value of the first surface 21 of the first circuit layer 2a (e.g., the top surface of the second metal structure 28a) is in a range of from about 5 nanometers (nm) to about 55 nm, from about 2 nm to about 80 nm, or from about 1 nm to about 100 nm.

Figure 5:
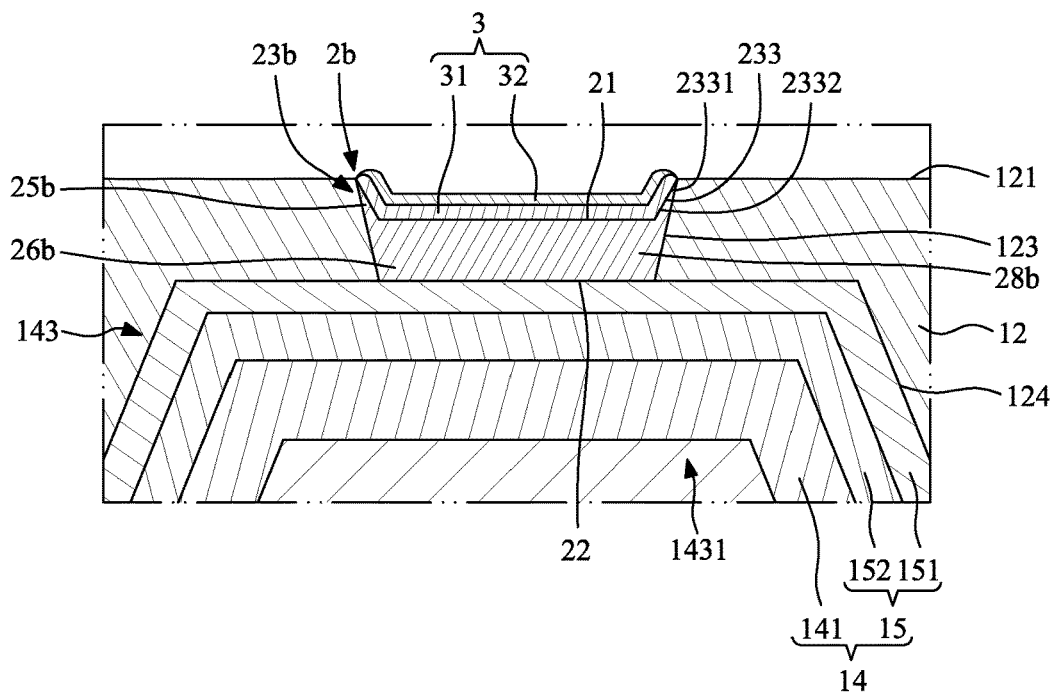
FIG. 5 illustrates an enlarged view of an area of a cross-sectional view of an example of a portion of a first circuit layer according to some embodiments of the present disclosure.

FIG. 5 illustrates an enlarged view of an area of a cross-sectional view of an example of a portion of a first circuit layer 2b according to some embodiments of the present disclosure. The first circuit layer 2b of FIG. 5 is similar to the first circuit layer 2 as shown in FIGS. 1-3, except that the conductive segment (e.g., the conductive trace 23b and/or the bonding pad) of the first circuit layer 2b is a monolithic structure rather than a double-layered structure. As shown in FIG. 5, the first metal structure 27 of FIG. 3 may be omitted. Thus, the conductive segment (e.g., the conductive trace 23b and/or the bonding pad) of the first circuit layer 2b may include a second metal structure 28b which may be, e.g., copper (Cu) (or another suitable conductive material). In some embodiments, the second metal structure 28b of the first circuit layer 2b may be similar to or the same as the second metal structure 28 of the first circuit layer 2 of FIG. 3. That is, in FIG. 5, the second metal structure 28b may be a single layer, and may not fill or may fill a portion of the recess portions 123 of the first dielectric structure 12. A width of the first portion 25b of the conductive segment (e.g., the conductive trace 23b and/or the bonding pad) is greater than a width of the second portion 26b of the conductive segment (e.g., the conductive trace 23b and/or the bonding pad). Thus, a width of the first portion 25b of the second metal structure 28b is greater than a width of the second portion 26b of the second metal structure 28b.

As shown in FIG. 5, the first portion 25b of the conductive segment (e.g., the conductive trace 23b or the bonding pad) defines a cavity 233 recessed from the first surface 121 of the first dielectric structure 12. Thus, a first surface 21 of the first circuit layer 2b is recessed from the first surface 121 of the first dielectric structure 12. The first surface 21 of the first circuit layer 2b defines the cavity 233. The cavity 233 has a first portion 2331 close to the first surface 121 of the first dielectric structure 12 and a second portion 2332 opposite to the first portion 2331. A width of the first portion 2331 of the cavity 233 is greater than a width of the second portion 2332 of the cavity 233. In addition, the barrier layer 3 is disposed in the cavity 233 of the conductive segment (e.g., the conductive trace 23b and/or the bonding pad) of the first circuit layer 2b. In some embodiments, the barrier layer 3 includes a nickel layer 31 and a gold layer 32. The nickel layer 31 is disposed in the cavity 233 of the conductive segment (e.g., the conductive trace 23b and/or the bonding pad) of the first circuit layer 2b, and the gold layer 32 is disposed on the nickel layer 31. Thus, the nickel layer 31 is disposed between the gold layer 32 and the conductive segment (e.g., the conductive trace 23b and/or the bonding pad) of the first circuit layer 2b.

Figure 6:
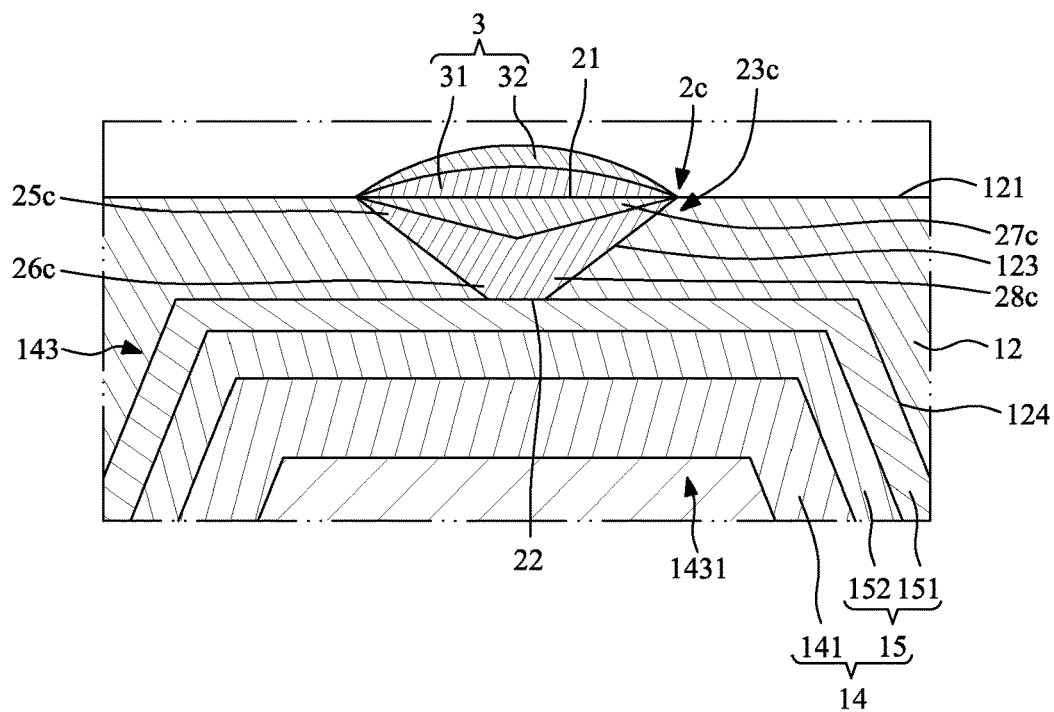
FIG. 6 illustrates an enlarged view of an area of a cross-sectional view of an example of a portion of a first circuit layer according to some embodiments of the present disclosure.

FIG. 6 illustrates an enlarged view of an area of a cross-sectional view of an example of a portion of a first circuit layer 2c according to some embodiments of the present disclosure. The first circuit layer 2c of FIG. 6 is similar to the first circuit layer 2 as shown in FIGS. 1-3, except that the conductive segment (e.g., the conductive trace 23c and/or the bonding pad) of the first circuit layer 2c is in an inverse triangular shape. As shown in FIG. 6, the conductive segment (e.g., the conductive trace 23c and/or the bonding pad 24) of the first circuit layer 2c may include a first metal structure 27c and a second metal structure 28c. The second metal structure 28c is disposed on the first metal structure 27c. In some embodiments, a material of the first metal structure 27c is titanium (Ti), and a material of the second metal structure 28c is copper (Cu). Further, the conductive segment (e.g., the conductive trace 23c and/or the bonding pad) includes a first portion 25c and a second portion 26c. The first portion 25c is close to or disposed adjacent to the first surface 121 of the first dielectric structure 12, and the second portion 26c is opposite to the first portion 25c. A width of the first portion 25c of the conductive segment (e.g., the conductive trace 23c and/or the bonding pad) is greater than a width of the second portion 26c of the conductive segment (e.g., the conductive trace 23c and/or the bonding pad).

Figure 7:
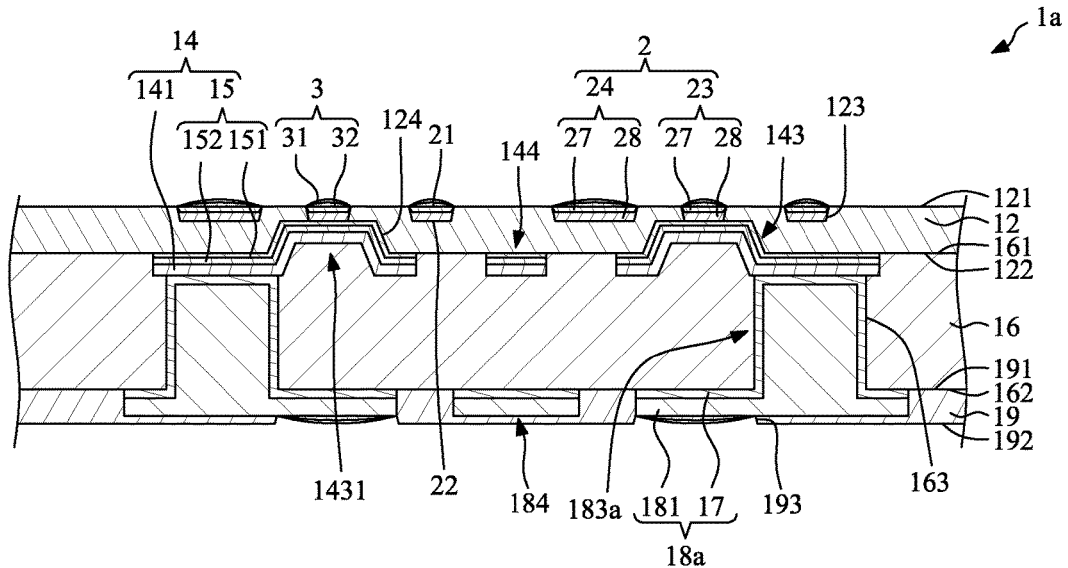
FIG. 7 illustrates a cross-sectional view of an example of a portion of a semiconductor substrate according to some embodiments of the present disclosure.

FIG. 7 illustrates a cross-sectional view of an example of a portion of a semiconductor substrate 1a according to some embodiments of the present disclosure. The semiconductor substrate 1a of FIG. 7 is similar to the semiconductor substrate 1 as shown in FIGS. 1-3, except that the third conductive via 183a of the third circuit layer 18 is in a pillar shape. As shown in FIG. 7, the third conductive via 183*a* may have a substantially consistent width.

Figure 8:
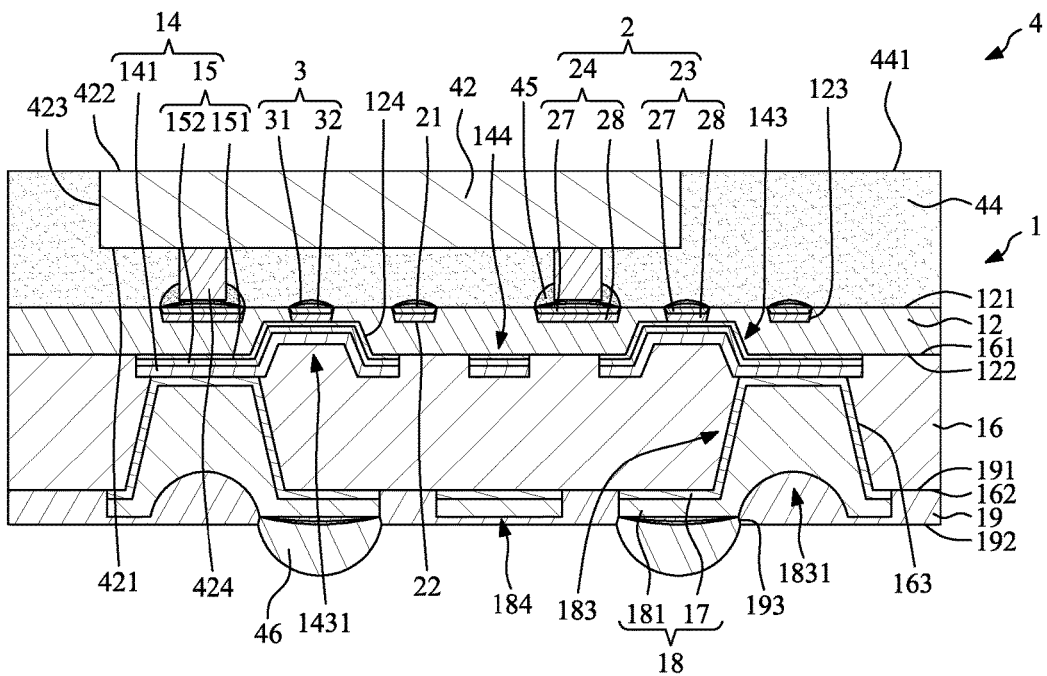
FIG. 8 illustrates a cross-sectional view of an example of a semiconductor package structure according to some embodiments of the present disclosure.

FIG. 8 illustrates a cross-sectional view of an example of a semiconductor package structure 4 according to some embodiments of the present disclosure. The semiconductor package structure 4 includes a semiconductor substrate 1, a semiconductor die 42, an encapsulant 44 and a plurality of external connectors 46. The semiconductor substrate 1 may be similar to or the same as the semiconductor substrate 1 as shown in FIGS. 1-3. Alternatively, or additionally, the semiconductor substrate 1 of FIG. 8 may be replaced by, e.g., a semiconductor substrate including the first circuit layer 2*a* (FIG. 4), a semiconductor substrate including the first circuit layer 2*b* (FIG. 5), a semiconductor substrate including the first circuit layer 2*c* (FIG. 6), or the semiconductor substrate 1*a* of FIG. 7.

The semiconductor die 42 is attached to the semiconductor substrate 1 and electrically connected to the first circuit layer 2. As shown in FIG. 8, the semiconductor die 42 has an active surface 421, a backside surface 422, a lateral surface 423 and a plurality of conductive bumps 424. The backside surface 422 is opposite to the active surface 421. The lateral surface 423 extends between the active surface 421 and the backside surface 422. The conductive bumps 424 are disposed adjacent to the active surface 421. Each of, or at least one of, the conductive bump 424 contacts the nickel layer 31 of the barrier layer 3 on the conductive segment (e.g., the bonding pad 24) of the first circuit layer 2. Thus, the semiconductor die 42 is attached to the semiconductor substrate 1 by flip chip bonding, and the semiconductor die 42 is electrically connected to the first circuit layer 2 of the semiconductor substrate 1 through the conductive bumps 424 and the barrier layer 3. In addition, a plurality of solders 45 cover the lower ends of the conductive bumps 424 and the barrier layer 3 to ensure the bonding between the conductive bumps 424 and the barrier layer 3.

The encapsulant 44, for example, a molding compound, covers the semiconductor die 42 and the semiconductor substrate 1. In some embodiments, the encapsulant 44 covers the first surface 121 of the first dielectric structure 12, portions (e.g., upper ends) of the conductive bumps 424, the active surface 421 of the semiconductor die 42 and the lateral surface 423 of the semiconductor die 42. A first surface 441 of the encapsulant 44 may be substantially coplanar with the backside surface 422 of the semiconductor die 42. Thus, the backside surface 422 of the semiconductor die 42 is exposed from the first surface 441 of the encapsulant 44. The external connectors 46 (e.g., solder bumps or solder balls) may be disposed in the respective ones of the openings 193 of the third dielectric structure 19 to contact the barrier layer 3 on the third circuit layer 18 for external connections.

Figure 9:
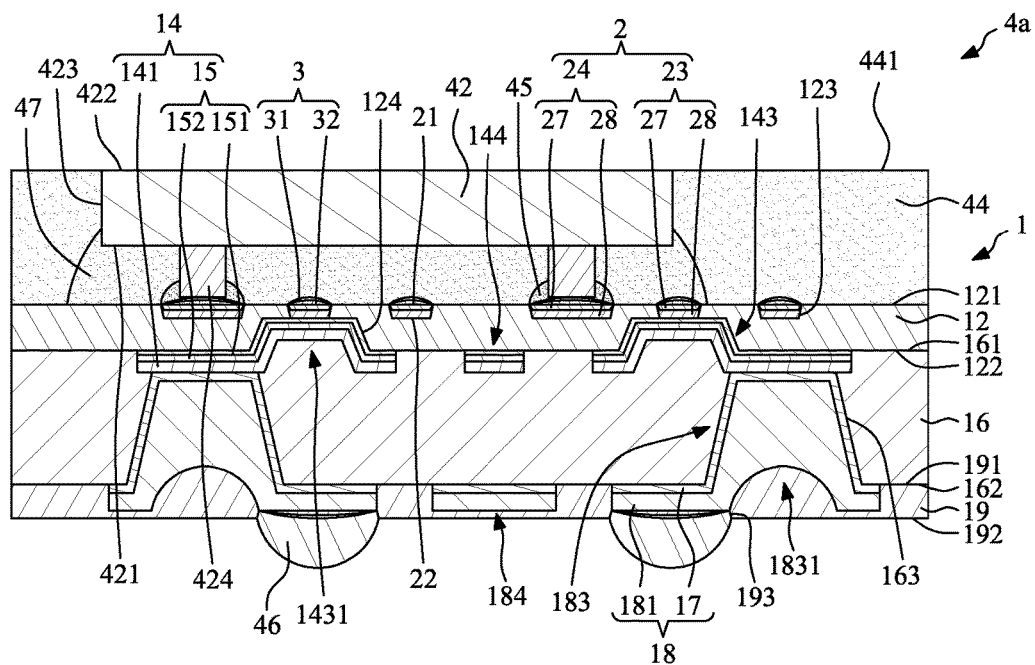
FIG. 9 illustrates a cross-sectional view of an example of a semiconductor package structure according to some embodiments of the present disclosure.

FIG. 9 illustrates a cross-sectional view of an example of a semiconductor package structure 4*a* according to some embodiments of the present disclosure. The semiconductor package structure 4*a* of FIG. 9 is similar to the semiconductor package structure 4 as shown in FIG. 8, except that an underfill 47 is disposed in the space between the active surface 421 of the semiconductor die 42 and the first surface 121 of the first dielectric structure 12 to cover the upper ends of the conductive bumps 424 and the solders 45. The encapsulant 44 covers the underfill 47, the first surface 121 of the first dielectric structure 12, and the lateral surface 423 of the semiconductor die 42.

Figure 10:
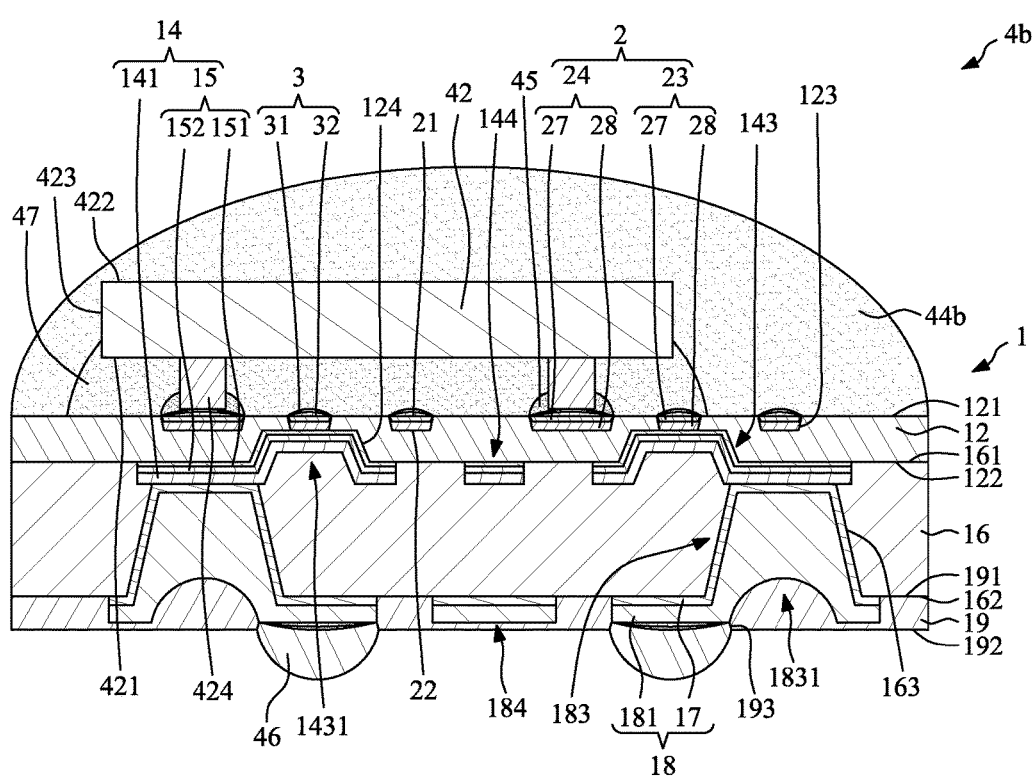
FIG. 10 illustrates a cross-sectional view of an example of a semiconductor package structure according to some embodiments of the present disclosure.

FIG. 10 illustrates a cross-sectional view of an example of a semiconductor package structure 4*b* according to some embodiments of the present disclosure. The semiconductor package structure 4*b* of FIG. 10 is similar to the semiconductor package structure 4*a* as shown in FIG. 9, except that the encapsulant 44*b* of FIG. 10 is a gel type.

Figure 11:
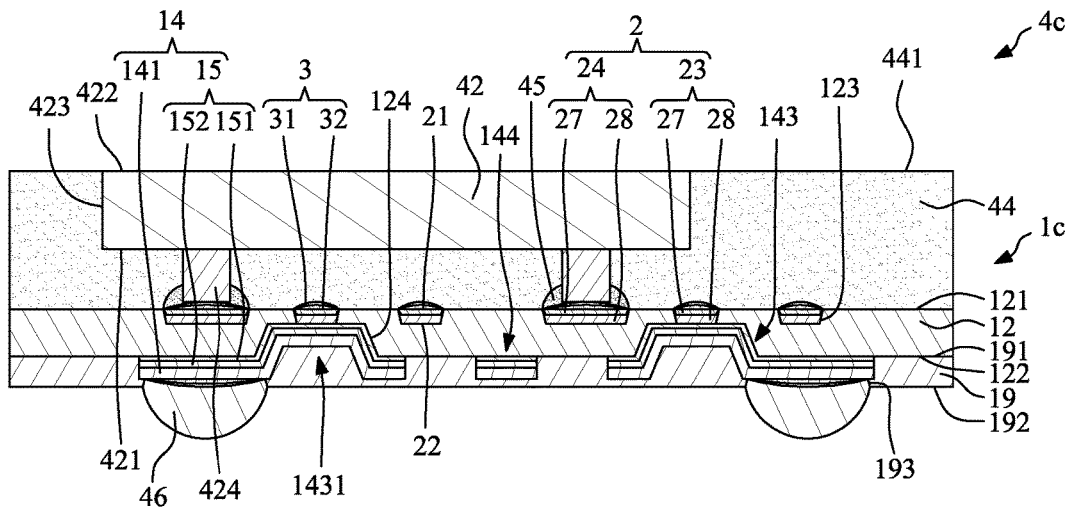
FIG. 11 illustrates a cross-sectional view of an example of a semiconductor package structure according to some embodiments of the present disclosure.

FIG. 11 illustrates a cross-sectional view of an example of a semiconductor package structure 4*c* according to some embodiments of the present disclosure. The semiconductor package structure 4*c* of FIG. 11 is similar to the semiconductor package structure 4 as shown in FIG. 8, except that the second dielectric structure 16, the third circuit layer 18 and the third conductive vias 183 of the semiconductor substrate 1 of FIG. 8 are omitted in the semiconductor substrate 1*c* of FIG. 11. Thus, the third dielectric structure 19 covers the second circuit layer 14 and the second surface 122 of the first dielectric structure 12. The first surface 191 of the third dielectric structure 19 contacts the second surface 122 of the first dielectric structure 12, and a portion of the third dielectric structure 19 extends into the central hole 1431 of the second conductive via 143 of the second circuit layer 14. In addition, the openings 193 of the third dielectric structure 19 expose portions of the second circuit layer 14 (e.g., portions corresponding to the second metal layer 141). The barrier layer 3 may be disposed on the exposed portions of the second circuit layer 14 (e.g., portions corresponding to the second metal layer 141) in the openings 193 of the third dielectric structure 19. The external connectors 46 (e.g., solder bumps or solder balls) may be disposed in the respective ones of the openings 193 of the third dielectric structure 19 to contact the barrier layer 3 on the second circuit layer 14 for external connections.

Figure 12:
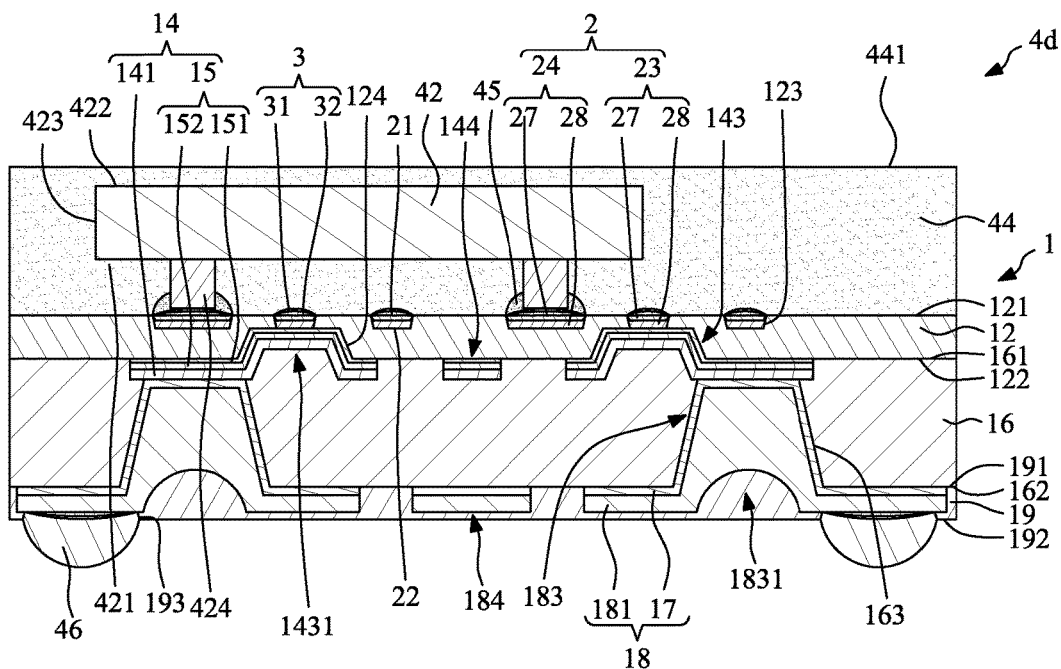
FIG. 12 illustrates a cross-sectional view of an example of a semiconductor package structure according to some embodiments of the present disclosure.

FIG. 12 illustrates a cross-sectional view of an example of a semiconductor package structure 4*d* according to some embodiments of the present disclosure. The semiconductor package structure 4*d* of FIG. 12 is similar to the semiconductor package structure 4 as shown in FIG. 8, except for the positions of the external connectors 46 (e.g., solder bumps or solder balls). In comparison, the semiconductor package structure 4 of FIG. 8 is a fan-in package structure, and the semiconductor package structure 4*d* of FIG. 12 is a fan-out package structure. In addition, the encapsulant 44 further covers the backside surface 422 of the semiconductor die 42. Thus, the first surface 441 of the encapsulant 44 may be higher than the backside surface 422 of the semiconductor die 42.

Figure 13:
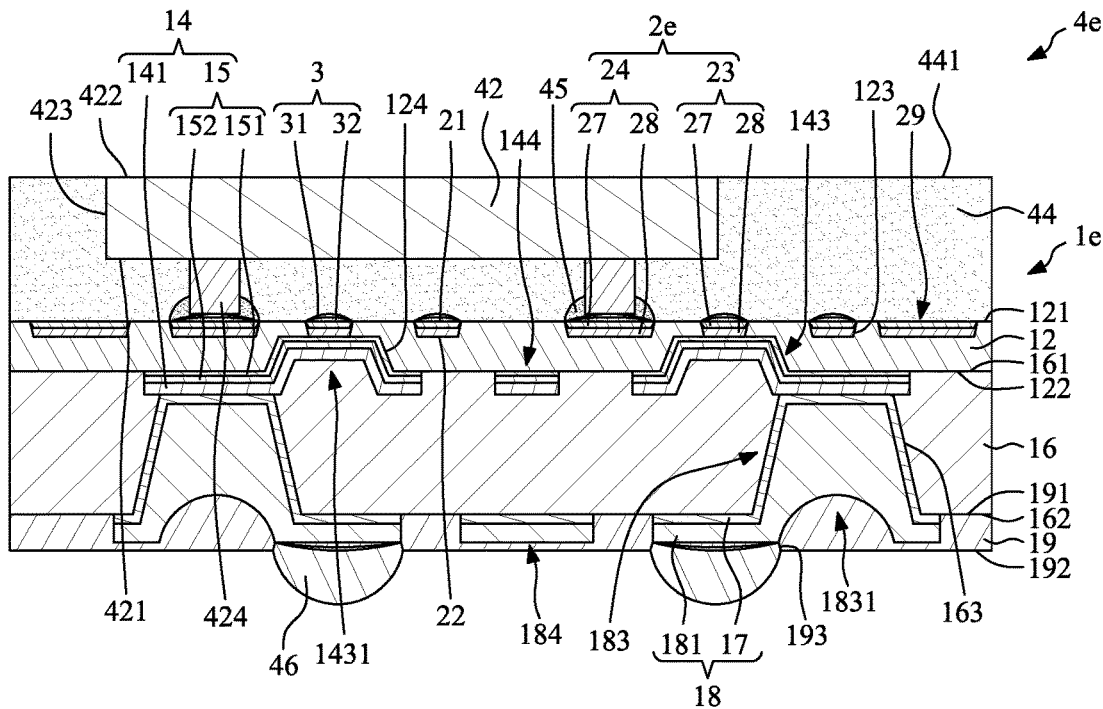
FIG. 13 illustrates a cross-sectional view of an example of a semiconductor package structure according to some embodiments of the present disclosure.

FIG. 13 illustrates a cross-sectional view of an example of a semiconductor package structure 4*e* according to some embodiments of the present disclosure. The semiconductor package structure 4*e* of FIG. 13 is similar to the semiconductor package structure 4 as shown in FIG. 8, except that the first circuit layer 2*e* of the semiconductor substrate 1*e* of the semiconductor package structure 4*e* of FIG. 13 further includes at least one additional portion 29. The additional portion 29 has a large area, and is used for controlling the warpage of the semiconductor substrate 1*e* and the semiconductor package structure 4. In some embodiments, an area of the additional portion 29 may be greater than an area of the bonding pad 24, and the additional portion 29 may have no electrical function (e.g., not electrically connected to other conductive components of the semiconductor package structure 4). For example, the additional portion 29 may have the first metal structure 27 and the second metal structure 28. That is, the additional portion 29, the conductive trace 23 and the bonding pad 24 may be formed concurrently.

Figure 14:
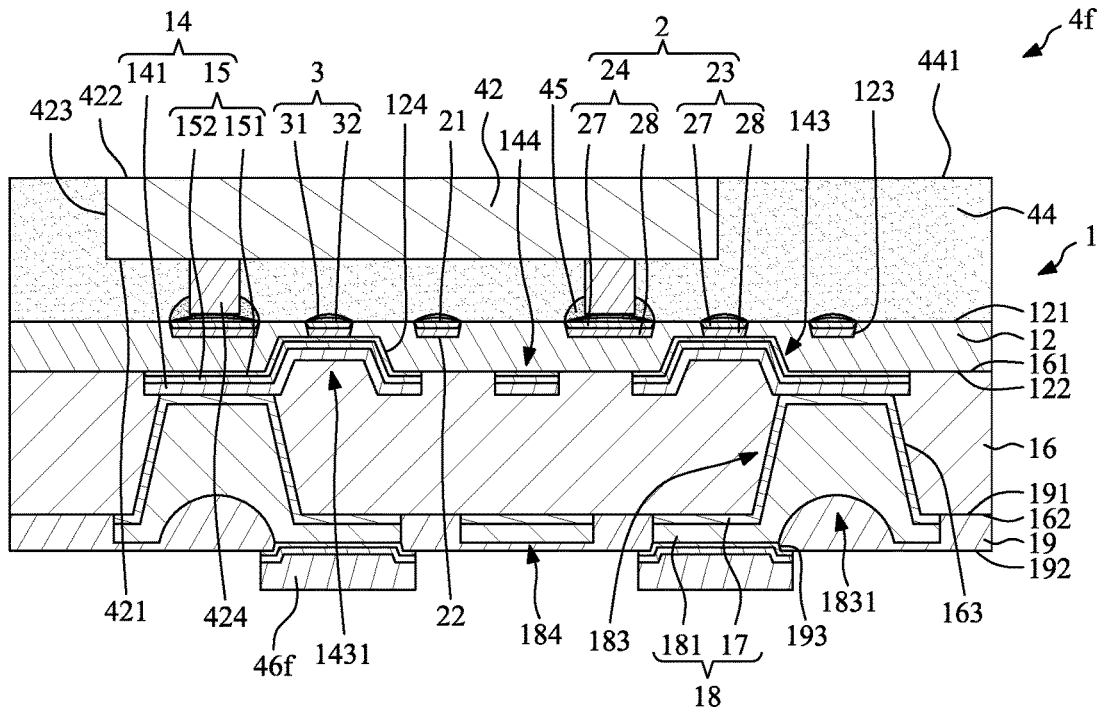
FIG. 14 illustrates a cross-sectional view of an example of a semiconductor package structure according to some embodiments of the present disclosure.

FIG. 14 illustrates a cross-sectional view of an example of a semiconductor package structure 4*f* according to some embodiments of the present disclosure. The semiconductor package structure 4*f* of FIG. 14 is similar to the semiconductor package structure 4 as shown in FIG. 8, except for the structure of the external connectors 46f. As shown in the FIG. 14, the external connectors 46f may be solder bumps that are rectangular solids.

FIGS. 15-39 illustrate various stages of some embodiments of a method for manufacturing a semiconductor device according to an aspect of the present disclosure. In some embodiments, the method is for manufacturing a semiconductor package structure such as the semiconductor package structure 4 shown in FIG. 8. Further, the method may be for manufacturing a semiconductor substrate such as the semiconductor substrate 1 shown in FIG. 1.

Figure 15:
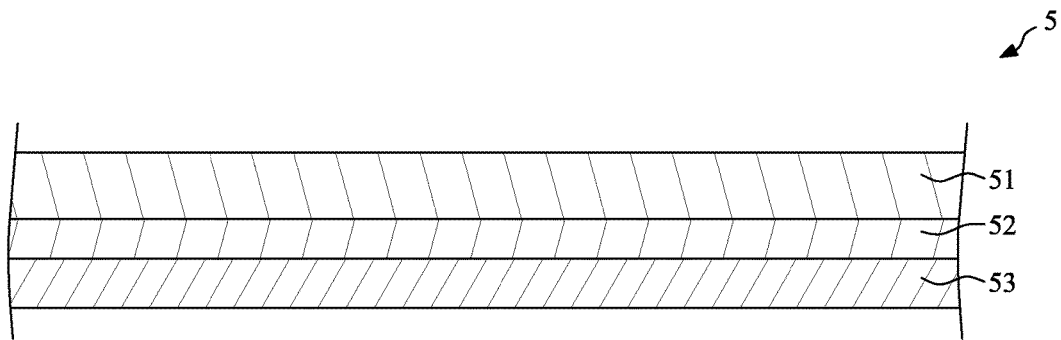
FIG. 15 illustrates one or more stages of some embodiments of a method for manufacturing a semiconductor device according to an aspect of the present disclosure.

Referring to FIG. 15, a stacked structure 5 is provided. The stacked structure 5 includes a first outermost layer 51, at least one intermediate layer 52 and a second outermost layer 53. The second outermost layer 53 is opposite to the first outermost layer 51. The intermediate layer 52 is interposed between the second outermost layer 53 and the first outermost layer 51. A reflective index of the stacked structure 5 increases gradually from the first outermost layer 51 to the second outermost layer 52. For example, a reflective index of the second outermost layer 52 is greater than a reflective index of the intermediate layer 52, and the reflective index of the intermediate layer 52 is greater than a reflective index of the first outermost layer 51. In some embodiments, the first outermost layer 51 is a topmost layer and may be a carrier. The first outermost layer 51 may be, for example, a metal material, a ceramic material, a glass material, a substrate, a semiconductor wafer, or a combination of two or more thereof. The shape of the first outermost layer 51 may be, for example, substantially rectangular or square. Alternatively, or additionally, the shape of the first outermost layer 51 may be, for example, substantially circular or elliptical. The intermediate layer 52 is attached to a surface of the first outermost layer 51, and may include a release layer or two or more suitable layers. The second outermost layer 53 is attached to a surface of the intermediate layer 52. Thus, the second outermost layer 53 may be a bottommost layer. The second outermost layer 53 may be a photoresist layer.

Figure 16:
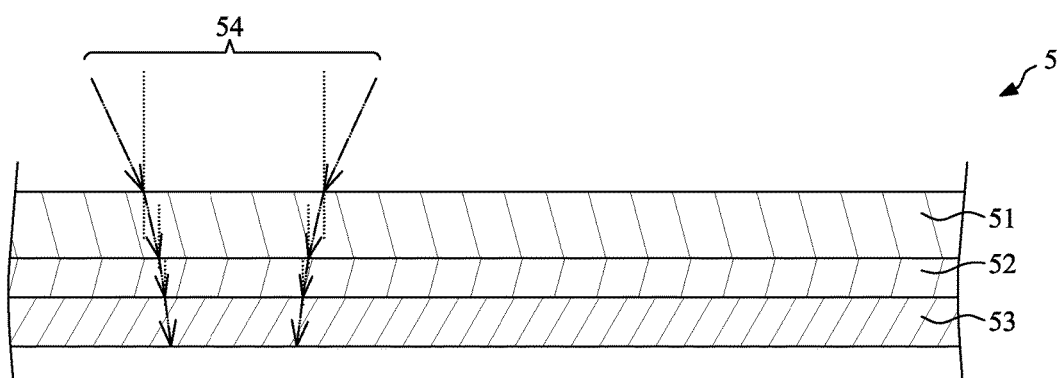
FIG. 16 illustrates one or more stages of some embodiments of a method for manufacturing a semiconductor device according to an aspect of the present disclosure.

Referring to FIG. 16, an exposure step is conducted. A light beam 54 near or above the first outermost layer 51 is provided to pass through the first outermost layer 51 and the intermediate layer 52 to irradiate the second outermost layer 53. It is noted a laser directing image (LDI) technology may be used in the exposure step. That is, a lithographic patterning process is conducted from a side of the first outermost layer 51 (such as a glass carrier) rather than a side of the second outermost layer 53 (such as a photoresist layer).

Figure 17:
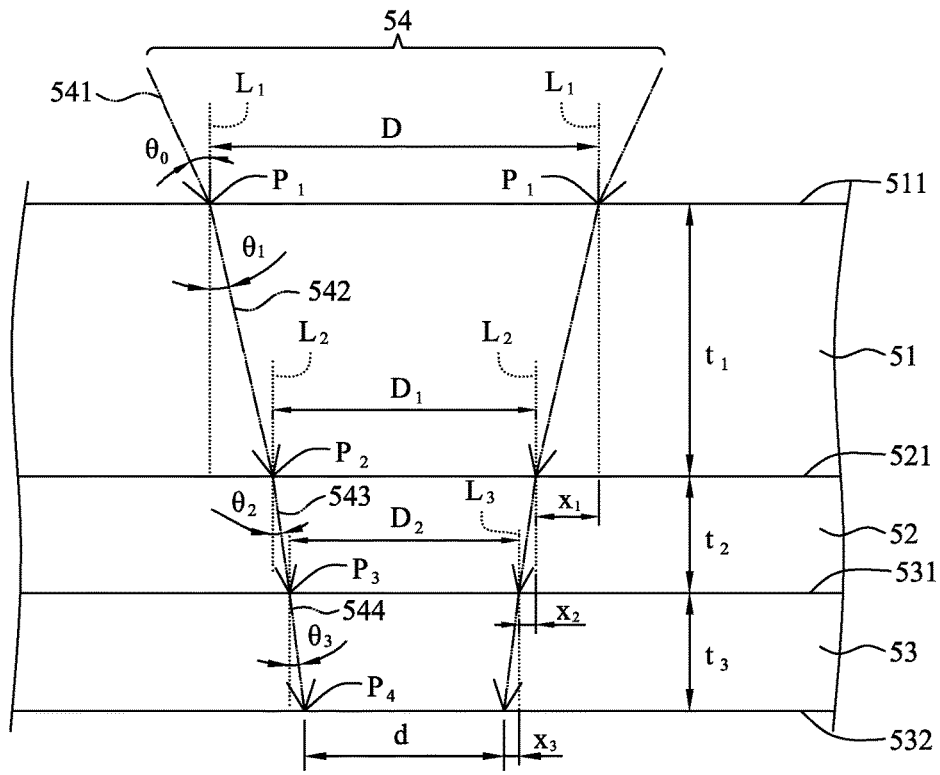
FIG. 17 illustrates an enlarged view of FIG. 16.

Referring to FIG. 17, which is an enlarged view of FIG. 16. The light beam 54 enters the first outermost layer 51 (having a thickness $t_1$ and a reflective index $n_1$) from air (with a reflective index $n_0$) by passing through the first surface 511 of the first outermost layer 51. On the first surface 511 of the first outermost layer 51, a width of an exposure area (i.e., pattern width) is defined as "D". The outermost portion of the light beam 54 is defined as incident light 541 which contacts the first surface 511 at point $P_1$. A normal line at point $P_1$ is defined as a first normal line $L_1$, which is normal to the first surface 511. An inclination angle $\theta_0$ between the first normal line $L_1$ and the incident light 541 is an incident angle. After entering the first outermost layer 51, the incident light 541 becomes a first light 542. At the point $P_1$, the first light 542 is a reflective light, and an inclination angle $\theta_1$ between the first normal line $L_1$ and the first light 542 is a reflective angle. Under Snell's law, $n_0*\sin\theta_0 = n_1*\sin\theta_1$; if $n_1 > n_0$, then $\sin\theta_1 < \sin\theta_0$, thus, $\theta_1 < \theta_0$.

The first light 542 enters the intermediate layer 52 (having a thickness $t_2$ and a reflective index $n_2$) from the first outermost layer 51 by passing through the first surface 521 of the intermediate layer 52. On the first surface 521 of the intermediate layer 52, a width of an exposure area is defined as "$D_1$". As shown in FIG. 17, $D_1 < D$. The first light 542 is defined as incident light which contacts the first surface 521 at point $P_2$. A normal line at point $P_2$ is defined as a second normal line $L_2$, which is normal to the first surface 521. An inclination angle $\theta_1$ between the second normal line $L_2$ and the first light 542 is an incident angle since the second normal line $L_2$ is parallel with the first normal line $L_1$. After entering the intermediate layer 52, the first light 542 becomes a second light 543. At the point $P_2$, the second light 543 is a reflective light, and an inclination angle $\theta_2$ between the second normal line $L_2$ and the second light 543 is a reflective angle. Under Snell's law, $n_1*\sin\theta_1 = n_2*\sin\theta_2$. As shown in FIG. 17, a reduced distance "$x_1$" is defined as $(D-D_1)/2$ That is, the reduced distance "$x_1$" is defined as the gap between the first normal line $L_1$ and the second normal line $L_2$. Alternatively, or additionally, $x_1 = t_1*\tan\theta_1$.

The second light 543 enters the second outermost layer 53 (having a thickness $t_3$ and a reflective index $n_3$) from the intermediate layer 52 by passing through the first surface 531 of the second outermost layer 53. On the first surface 531 of the second outermost layer 53, a width of an exposure area is defined as "$D_2$". As shown in FIG. 17, $D_2 < D_1$. The second light 543 is defined as incident light which contacts the first surface 531 at point $P_3$. A normal line at point $P_3$ is defined as a third normal line $L_3$, which is normal to the first surface 531. An inclination angle $\theta_2$ between the third normal line $L_3$ and the second light 543 is an incident angle since the third normal line $L_3$ is parallel with the second normal line $L_2$. After entering the second outermost layer 53, the second light 543 becomes a third light 544. At the point $P_3$, the third light 544 is a reflective light, and an inclination angle $\theta_3$ between the third normal line $L_3$ and the third light 544 is a reflective angle. Under Snell's law, $n_2*\sin\theta_2 = n_3*\sin\theta_3$. As shown in FIG. 17, a reduced distance "$x_2$" is defined as $(D_1-D_2)/2$. That is, the reduced distance "$x_2$" is defined as the gap between the second normal line $L_2$ and the third normal line $L_3$. Alternatively, or additionally, $x_2 = t_2*\tan\theta_2$.

The third light 544 enters the air (with a reflective index $n_0$) from the second outermost layer 53 (with a reflective index $n_3$) by passing through the second surface 532 of the second outermost layer 53. On the second surface 532 of the second outermost layer 53, a width of an exposure area is defined as "d". The third light 544 is defined as incident light which contacts the second surface 532 at point $P_4$. As shown in FIG. 17, a reduced distance "$x_3$" is defined as $(D_2-d)/2$, that is, the reduced distance $x_3 = t_3*\tan\theta_3$. In addition, $d < D_2$.

As stated above, for a general case, in the topmost layer (having a thickness $t_1$ and a reflective index $n_1$):

$$n_0*\sin\theta_0 = n_1\sin\theta_1,$$

$$\theta_1 = \sin^{-1}(n_0\sin\theta_0/n_1),$$

$$x_1 = t_1\tan\theta_1 = t_1\tan[\sin^{-1}(n_0*\sin\theta_0/n_1)].$$

In the bottommost layer (having a thickness $t_m$ and a reflective index $n_m$):

$$n_{m-1}\sin\theta_{m-1} = n_m\sin\theta_m,$$

$$\theta_m = \sin^{-1}(n_{m-1}\sin\theta_{m-1}/n_m),$$

$$x_m = t_m\tan\theta_m = t_m\tan[\sin^{-1}(n_{m-1}\sin\theta_{m-1}/n_m)].$$

On the bottom surface of the bottommost layer, the width d of an exposure area is:

$$d = D - 2\sum_{k=1}^{m} x_k.$$

As a result, an opening reduction (d/D) of a light beam is:

$$d/D = 1 - 2\left(\sum_{k=1}^{m} x_k\right)\bigg/ D.$$

In some embodiments, the air above the stacked structure 5 can be treated as a first layer which has a reflective index $n_0$ of 1. The first outermost layer 51 (such as a glass carrier) can be treated as a first layer which has a thickness $t_1$ of about 500 μm to about 1500 μm and a reflective index $n_1$ of about 1.3 to about 2.2. The intermediate layer 52 (such as a release layer) can be treated as a second layer which has a thickness $t_2$ of about 0.5 μm to about 2 μm and a reflective index $n_2$ of about 1.5 to about 2.5. The second outermost layer 53 (such as a photoresist layer) can be treated as a third layer which has a thickness $t_3$ of about 3 μm to about 10 μm and a reflective index $n_3$ of about 1.6 to about 2.7. Table 1 below illustrates simulation results of case A and case B according to some embodiments of the present disclosure, wherein in case A, $\theta_0$ is equal to about 0.05°, D is equal to about 2 μm; and in case B, $\theta_0$ is equal to about 0.1°, D is equal to about 5 μm.

TABLE 1 simulation results of case A and case B

| Case # | Layer # | 1st Medium Air | 2nd Glass | 3rd Release Layer | 4th Photoresist Layer | d | d/D |
|---|---|---|---|---|---|---|---|
| A | n | 1 | $n_1$ = 1.55 | $n_2$ = 1.66 | $n_3$ = 1.68 | 0.75 μm | 9.3% |
|  | $\theta_0$ | 0.05° | — | — | — |  |  |
|  | t | — | $t_1$ = 1100 μm | $t_2$ = 1 μm | $t_3$ = 10 μm |  |  |
|  | x | — | $x_1$ = 0.62 μm | $x_2$ = 0.001 μm | $x_3$ = 0.01 μm |  |  |
|  | D | 2 μm | — | — | — |  |  |
| B | n | 1 | $n_1$ = 1.55 | $n_2$ = 1.66 | $n_3$ = 1.68 | 1.83 μm | 36.5% |
|  | $\theta_0$ | 0.1° | — | — | — |  |  |
|  | t | — | $t_1$ = 1400 μm | $t_2$ = 1 μm | $t_3$ = 10 μm |  |  |
|  | x | — | $x_1$ = 1.58 μm | $x_2$ = 0.001 μm | $x_3$ = 0.01 μm |  |  |
|  | D | 5 μm | — | — | — |  |  |

As shown in Table 1 above, in case A, D can be reduced from 2 μm to 0.75 μm, and in case B, D can be reduced from 5 μm to 1.83 μm. Thus, after a development step, the openings of the second outermost layer 53 (such as a photoresist layer) can have a small width and/or a small size. In addition, a laser directing image (LDI) technology may be used in the exposure step. The second outermost layer 53 (such as a photoresist layer) can be patterned by the light beam 54 more than two times, and the positions that the light beam 54 contacts the first outermost layer 51 (such as a glass carrier) at different time of patterning can be very close. Thus, after a development step, the openings of the second outermost layer 53 (such as a photoresist layer) can have a small gap.

Figure 18:
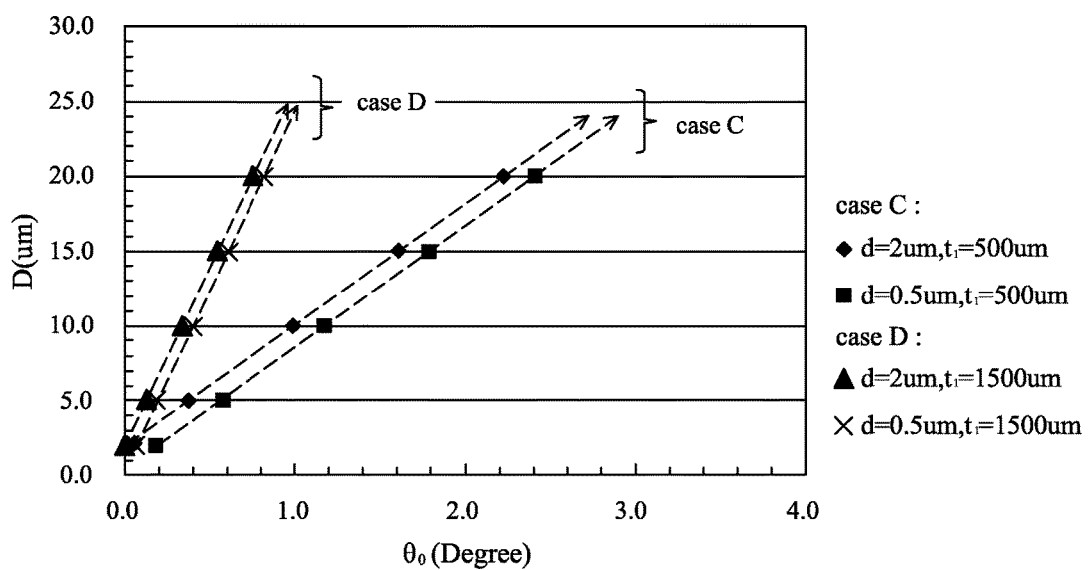
FIG. 18 illustrates simulation results of example cases according to some embodiments of the present disclosure.

FIG. 18 illustrates simulation results of case C and case D according to some embodiments of the present disclosure. Domain factors with respect to influence exposure width d may be: the thickness $t_1$ of the first outermost layer 51 (such as a glass carrier), the incident angle $\theta_0$ of the light beam 54 and the pattern width D. Relationships between G, $\theta_0$ and D values are shown in FIG. 18. In case C, the first outermost layer 51 (such as a glass carrier) has a thickness $t_1$ of about 500 μm and a reflective index $n_1$ of about 2.2. The intermediate layer 52 (such as a release layer) has a reflective index $n_2$ of about 2.5. The second outermost layer 53 (such as a photoresist layer) has a reflective index $n_3$ of about 2.7. The other factors are: about 0.5 μm<d< about 2 μm, about 2 μm<D< about 25 μm and 0<$\theta_0$< about 3°. In case D, the first outermost layer 51 (such as a glass carrier) has a thickness $t_1$ of about 1500 μm and a reflective index $n_1$ of about 2.2. The intermediate layer 52 (such as a release layer) has a reflective index $n_2$ of about 2.5. The second outermost layer 53 (such as a photoresist layer) has a reflective index $n_3$ of about 2.7. The other factors are: about 0.5 μm<d< about 2 μm, about 2 μm<D< about 25 μm and 0<$\theta_0$< about 1°. Therefore, if $t_1$ and d are predetermined, $\theta_0$ and D can be specified based on FIG. 18.

Figure 19:
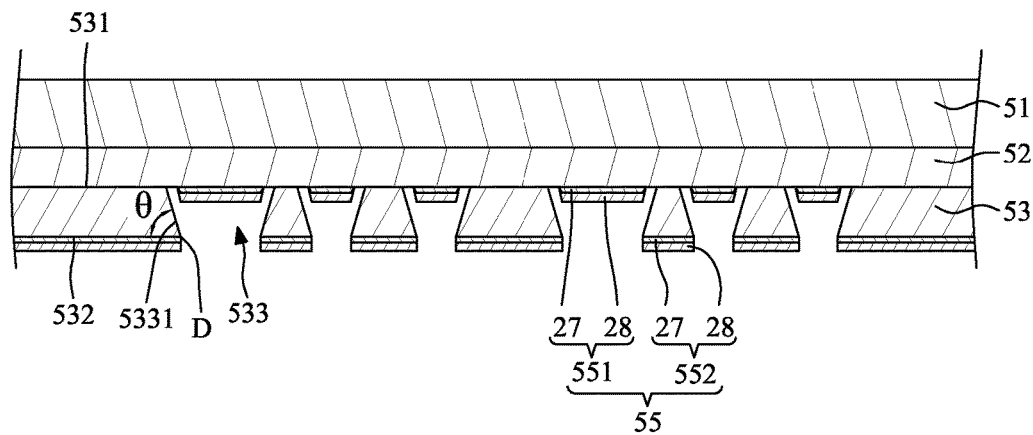
FIG. 19 illustrates one or more stages of some embodiments of a method for manufacturing a semiconductor device according to an aspect of the present disclosure.

Referring to FIG. 19, a development step is conducted to the second outermost layer 53. That is, the second outermost layer 53 is developed to form a plurality of openings 533. The openings 533 extend through the second outermost layer 53 to expose portions of the intermediate layer 52. An angle θ between side walls 5331 of the openings 533 of the second outermost layer 53 and an outermost surface (i.e., the second surface 532) of the second outermost layer 53 may be less than about 90 degrees. The size and position of the opening 533 correspond to the third light 544 of FIG. 17, thus, the opening 533 is tapered from the first surface 531 of the second outermost layer 53 to the second surface 532 of the second outermost layer 53. As shown in FIG. 19, the side wall 5331 of the opening 533 and the outermost surface (e.g., the second surface 532) of the second outermost layer 53 intersect at point "D".

A metal structure 55 is formed or disposed on the second surface 532 of the second outermost layer 53 and on the exposed portions of the intermediate layer 52 in the openings 533 of the second outermost layer 53 by, for example, sputtering such as physical vapor deposition (PVD). The metal structure 55 includes a first portion 551 and a second portion 552. The first portion 551 does not connect the second portion 552, and there is a gap between the first portion 551 and the second portion 552. The first portion 551 is disposed in the openings 533 of the second outermost layer 53 and forms the first circuit layer 2. The second portion 552 is disposed on the second surface 532 of the second outermost layer 53, and may be removed.

In some embodiments, the metal structure 55 may be a double-layered structure (or multi-layered structure), and may include a base metal layer (e.g., a first metal structure 27) and an outer metal layer (e.g., a second metal structure 28). The outer metal layer (the second metal structure 28) is disposed on the base metal layer (the first metal structure 27). During a manufacturing process, the base metal layer (the first metal structure 27) is formed or disposed on the second surface 532 of the second outermost layer 53 and in the openings 533 of the second outermost layer 53 by, for example, sputtering such as physical vapor deposition (PVD). A bonding force between the base metal layer (the first metal structure 27) and a non-metal layer (e.g., the second outermost layer 53) may be greater than a bonding force between a copper layer and the non-metal layer.

In some embodiments, a material of the first metal structure 27 is titanium (Ti). The outer metal layer (the second metal structure 28) is formed or disposed on the base metal layer (the first metal structure 27) by, for example, sputtering such as physical vapor deposition (PVD).

In some embodiments, a material of the second metal structure 28 is copper (Cu). A thickness of the first metal structure 27 may be greater than or equal to about 0.1 μm, and a thickness of the second metal structure 28 may be greater than or equal to about 0.2 μm. In some embodiments, the thickness of the first metal structure 27 may be in a range of about 0.1 μm to about 0.2 μm, about 0.05 μm to about 0.25 μm, or about 0.02 μm to about 0.28 μm, and the thickness of the second metal structure 28 may be in a range of about 0.2 μm to about 0.3 μm, about 0.15 μm to about 0.35 μm, or about 0.12 μm to about 0.38 μm. In addition, after the sputtering process, the point "C" of the first metal structure 27 and the point "B" of the second metal structure 28 may be aligned with the point "D" of the second outermost layer 53 due to Brownian motion.

Figure 20:
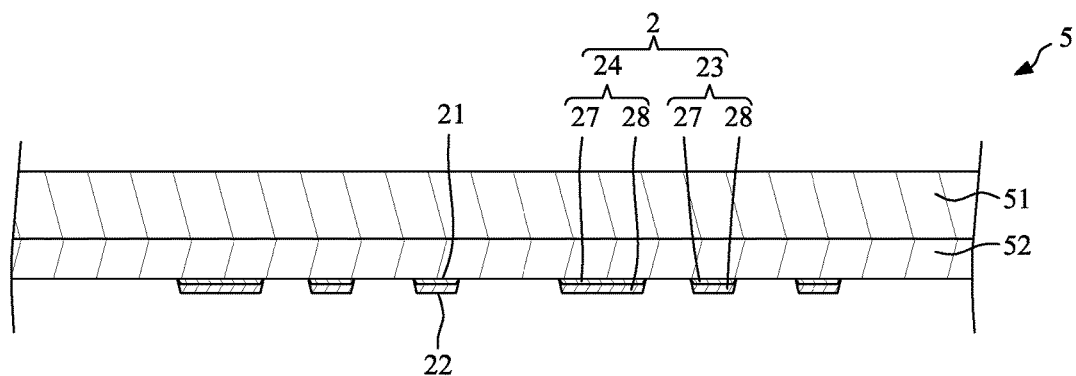
FIG. 20 illustrates one or more stages of some embodiments of a method for manufacturing a semiconductor device according to an aspect of the present disclosure.

Referring to FIG. 20, the second outermost layer 53 and the second portion 552 of the metal structure 55 disposed on the second surface 532 of the second outermost layer 53 are removed by, for example, stripping. Meanwhile, the first portion 551 of the metal structure 55 becomes the first circuit layer 2. The first circuit layer 2 includes a first surface 21 and a second surface 22 opposite to the first surface 21. The first circuit layer 2 may include a plurality of conductive segments, for example, a plurality of conductive traces 23 and/or a plurality of bonding pads 24. The conductive segment (e.g., the conductive trace 23 or the bonding pad 24) of the first circuit layer 2 includes the first metal structure 27 and the second metal structure 28.

In one or more embodiments, a line width/line space (L/S) of the first circuit layer 2 may be equal to or less than about 2 μm/about 2 μm (such as, for example, about 1.8 μm/about 1.8 μm or less, about 1.6 μm/about 1.6 μm or less, or about 1.4 μm/about 1.4 μm or less), equal to or less than about 1 μm/about 1 μm, or equal to or less than about 0.5 μm/about 0.5 μm. Further, a surface roughness value (e.g., in terms of root mean square surface roughness) of the first surface 21 of the first circuit layer 2 may be in a range of from about 5 nanometers (nm) to about 55 nm, from about 2 nm to about 80 nm, or from about 1 nm to about 100 nm.

Figure 21:
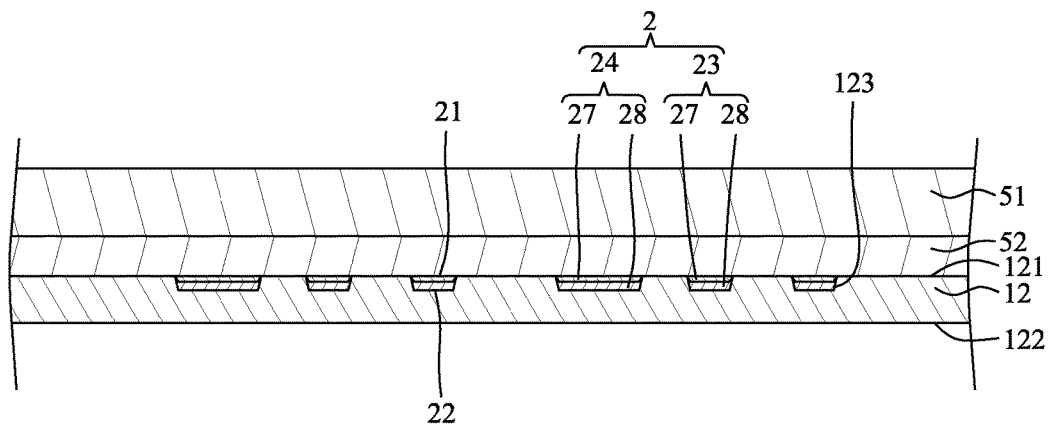
FIG. 21 illustrates one or more stages of some embodiments of a method for manufacturing a semiconductor device according to an aspect of the present disclosure.

Referring to FIG. 21, a first dielectric structure 12 is formed or disposed to cover the first circuit layer 2 and the intermediate layer 52 by for example, coating. Thus, the first circuit layer 2 is embedded in the first dielectric structure 12. The first dielectric structure 12 may have a first surface 121 and a second surface 122 opposite to the first surface 121. The first dielectric structure 12 may define a plurality of recess portions 123. The recess portions 123 are recessed from the first surface 121 of the first dielectric structure 12, and do not extend through the first dielectric structure 12. The first circuit layer 2 is disposed in the recess portions 123 of the first dielectric structure 12, and does not protrude from the first surface 121 of the first dielectric structure 12.

Figure 22:
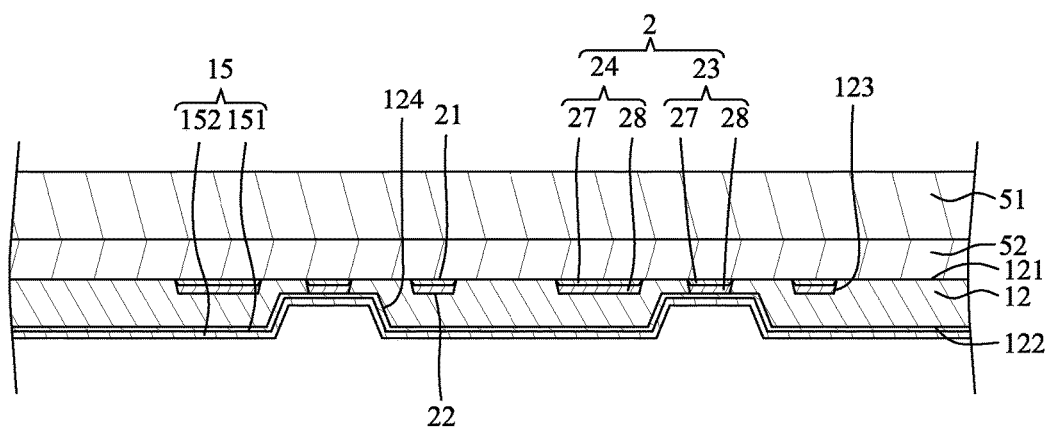
FIG. 22 illustrates one or more stages of some embodiments of a method for manufacturing a semiconductor device according to an aspect of the present disclosure.

Referring to FIG. 22, a plurality of openings 124 are formed from the second surface 122 of the first dielectric structure 12 by, for example, lithographic patterning process. The openings 124 are recessed from the second surface 122 of the first dielectric structure 12, and do not extend through the first dielectric structure 12. The positions of the openings 124 correspond to some of the recess portions 123. Therefore, some portions (e.g., the second surface 22) of the first circuit layer 2 may be exposed from the openings 124 of the first dielectric structure 12.

A second seed layer 15 is formed or disposed on and contacts the conductive trace 23 of the first circuit layer 2 in the opening 124 of the first dielectric structure 12, and is formed or disposed on and contacts the second surface 122 of the first dielectric structure 12 by, for example, PVD. In some embodiments, the second seed layer 15 may be a two-layered structure (or multi-layered structure), and may include a first layer 151 and a second layer 152. The material of the first layer 151 may be titanium (Ti), and the material of the second layer 152 may be copper (Cu).

Figure 23:
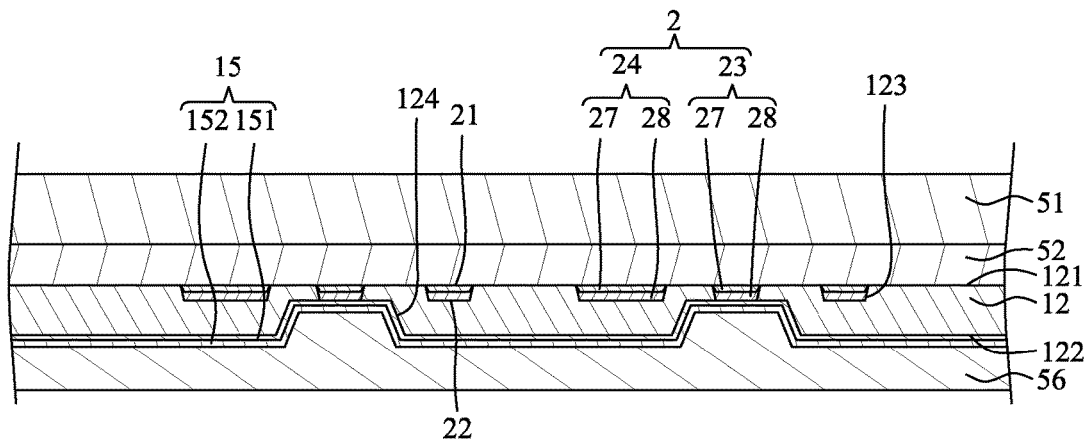
FIG. 23 illustrates one or more stages of some embodiments of a method for manufacturing a semiconductor device according to an aspect of the present disclosure.

Referring to FIG. 23, a photoresist layer 56 is formed or disposed to cover the second seed layer 15.

Figure 24:
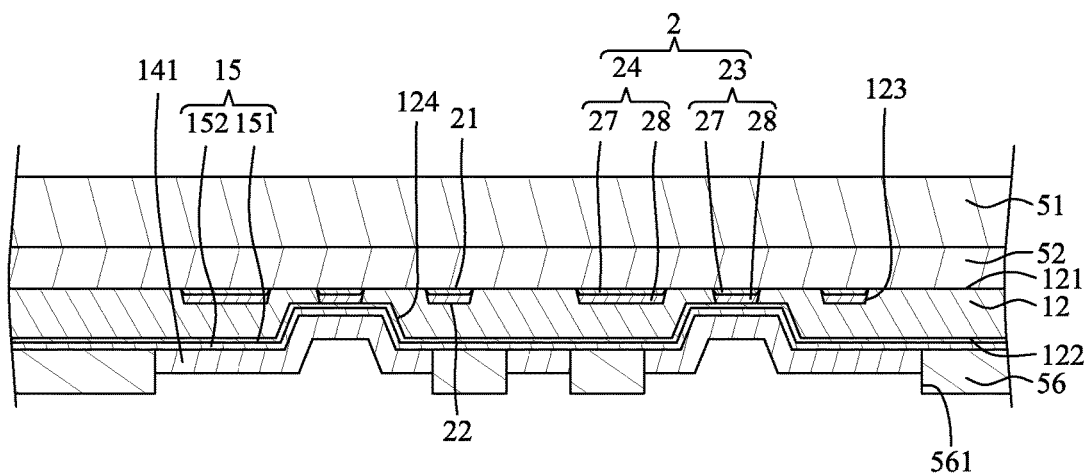
FIG. 24 illustrates one or more stages of some embodiments of a method for manufacturing a semiconductor device according to an aspect of the present disclosure.

Referring to FIG. 24, a plurality of openings 561 are formed in the photoresist layer 56 by, for example, lithographic patterning process, to expose portions of the second seed layer 15. A second metal layer 141 is disposed on the exposed portions of the second seed layer 15 in the openings 561 by, for example, plating. A material of the second metal layer 141 may be copper (Cu).

Figure 25:
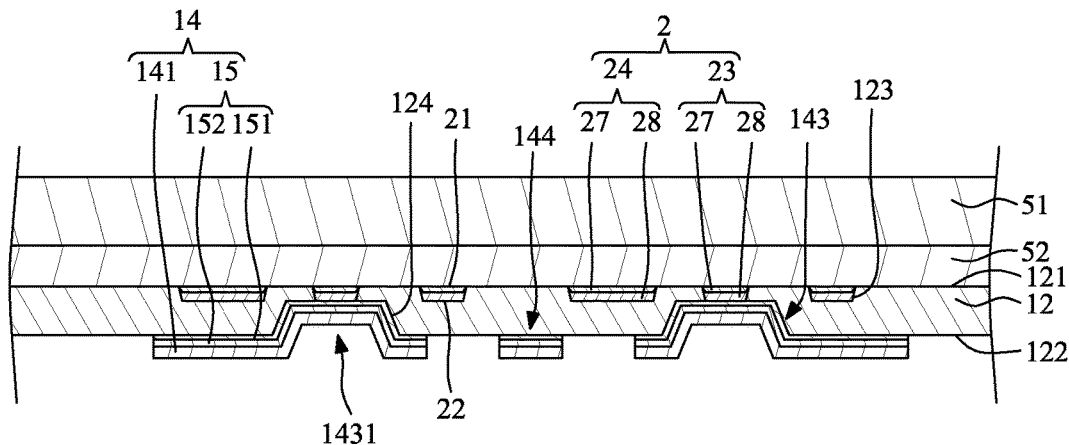
FIG. 25 illustrates one or more stages of some embodiments of a method for manufacturing a semiconductor device according to an aspect of the present disclosure.

Referring to FIG. 25, the photoresist layer 56 is removed by, for example, stripping. Then, portions of the second seed layer 15 that are not covered by the second metal layer 141 are removed by, for example, etching. Meanwhile, a second circuit layer 14 is formed or disposed on the first dielectric structure 12. The second circuit layer 14 includes the second seed layer 15 and the second metal layer 141. In some embodiments, a portion of the second circuit layer 14 is disposed in the opening 124 of the first dielectric structure 12 so to form a second conductive via 143, and the other portion of the second circuit layer 14 is disposed on the second surface 122 of the first dielectric structure 12 so as to form a second patterned layer 144 which may include at least one conductive trace and/or at least one bonding pad.

The second conductive via 143 is electrically connected to and contacts the conductive trace 23 of the first circuit layer 2. Thus, the second circuit layer 14 is electrically connected to the first circuit layer 2 through the second conductive via(s) 143. The second conductive via 143 may be a tapered structure that is tapered from the second surface 122 of the first dielectric structure 12 toward the first surface 121 of the first dielectric structure 12. The second conductive via 143 may define a central hole 1431. It is noted that the second conductive via(s) 143 may include at least a portion of the second seed layer 15 and the second metal layer 141, and the second patterned layer 144 may include at least a portion of the second seed layer 15 and the second metal layer 141. The second conductive via 143 and the second patterned layer 144 may be formed integrally and concurrently. An L/S of the second circuit layer 14 may be less than, for example, about 7 μm/about 7 μm, about 5 μm/about 5 μm, or about 2 μm/about 2 μm. The L/S of the second circuit layer 14 may be greater than the L/S of the first circuit layer 2.

Figure 26:
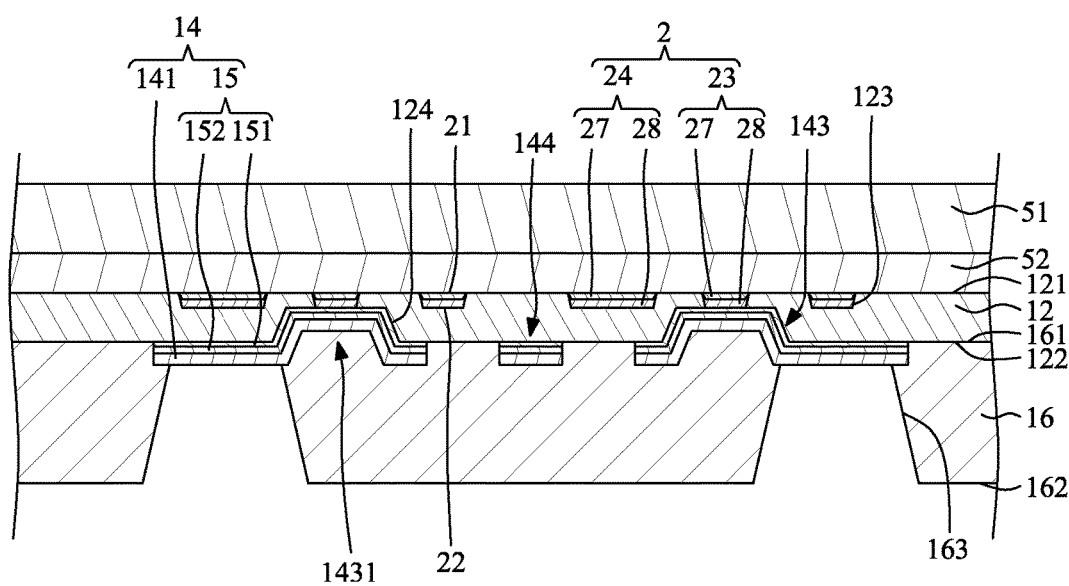
FIG. 26 illustrates one or more stages of some embodiments of a method for manufacturing a semiconductor device according to an aspect of the present disclosure.

Referring to FIG. 26, a second dielectric structure 16 is formed to cover the second circuit layer 14 and the second surface 122 of the first dielectric structure 12. The second dielectric structure 16 includes a first surface 161 and a second surface 162 opposite to the first surface 161. The first surface 161 of the second dielectric structure 16 contacts the second surface 122 of the first dielectric structure 12, and a portion of the second dielectric structure 16 extends into the central hole 1431 of the second conductive via 143 of the second circuit layer 14. Then, a plurality of openings 163 are formed in the second dielectric structure 16 by, for example, laser drilling, to expose portions of the second circuit layer 14 (e.g., portions corresponding to the second metal layer 141). The openings 163 of the second dielectric structure 16 may extend through the second dielectric structure 16.

Figure 27:
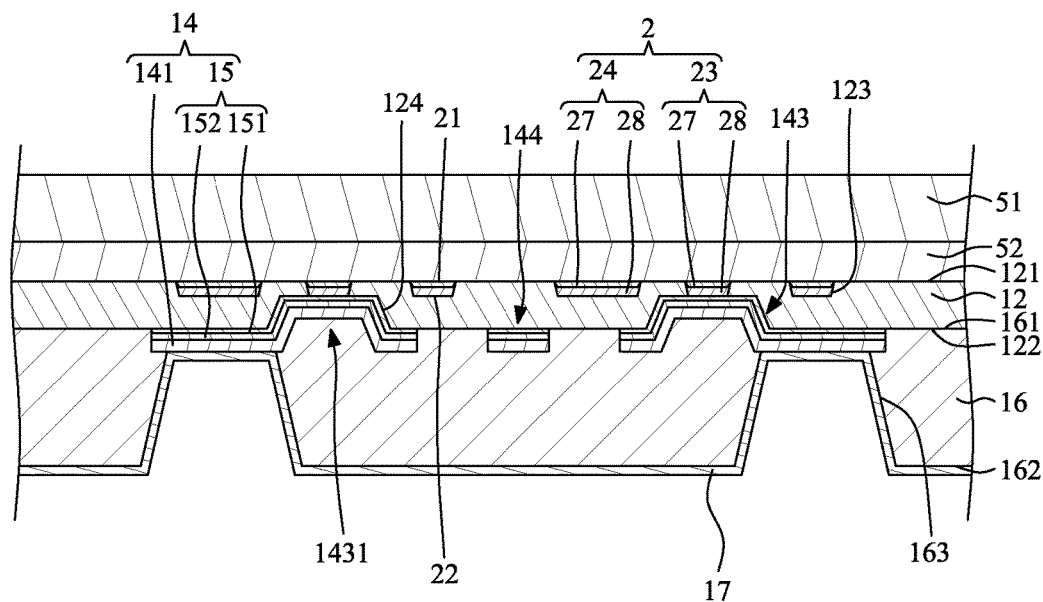
FIG. 27 illustrates one or more stages of some embodiments of a method for manufacturing a semiconductor device according to an aspect of the present disclosure.

Referring to FIG. 27, a third seed layer 17 is formed or disposed on and contacts the exposed portions of the second circuit layer 14 in the openings 163 of the second dielectric structure 16, and is disposed on and contacts the second surface 162 of the second dielectric structure 16 by, for example, electroless plating. In some embodiments, the third seed layer 17 may be a single-layered or two-layered structure (or a multi-layered structure). For example, the third seed layer 17 may include a titanium (Ti) layer and a copper (Cu) layer.

Figure 28:
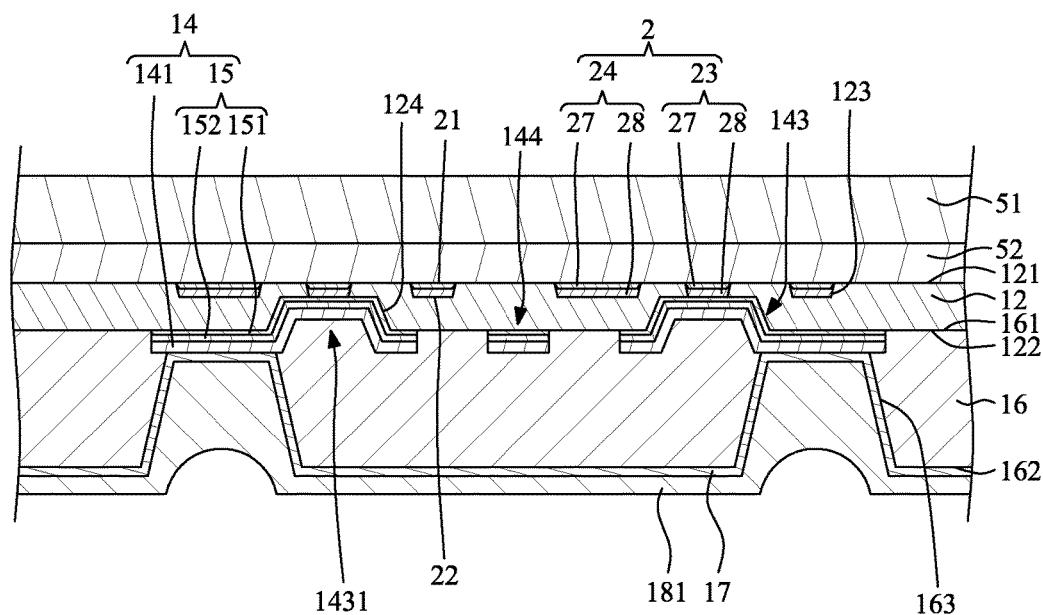
FIG. 28 illustrates one or more stages of some embodiments of a method for manufacturing a semiconductor device according to an aspect of the present disclosure.

Referring to FIG. 28, a third metal layer 181 is formed or disposed on the third seed layer 17 by, for example, overall plating.

Figure 29:
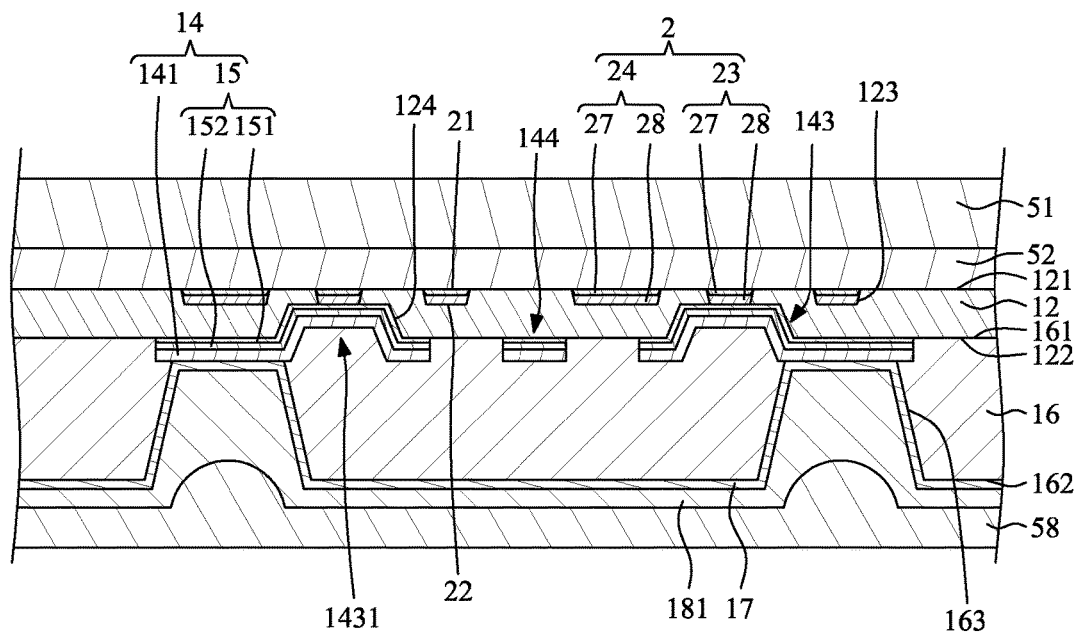
FIG. 29 illustrates one or more stages of some embodiments of a method for manufacturing a semiconductor device according to an aspect of the present disclosure.

Referring to FIG. 29, a photoresist layer 58 is formed or disposed on the third metal layer 181 by, for example, lamination.

Figure 30:
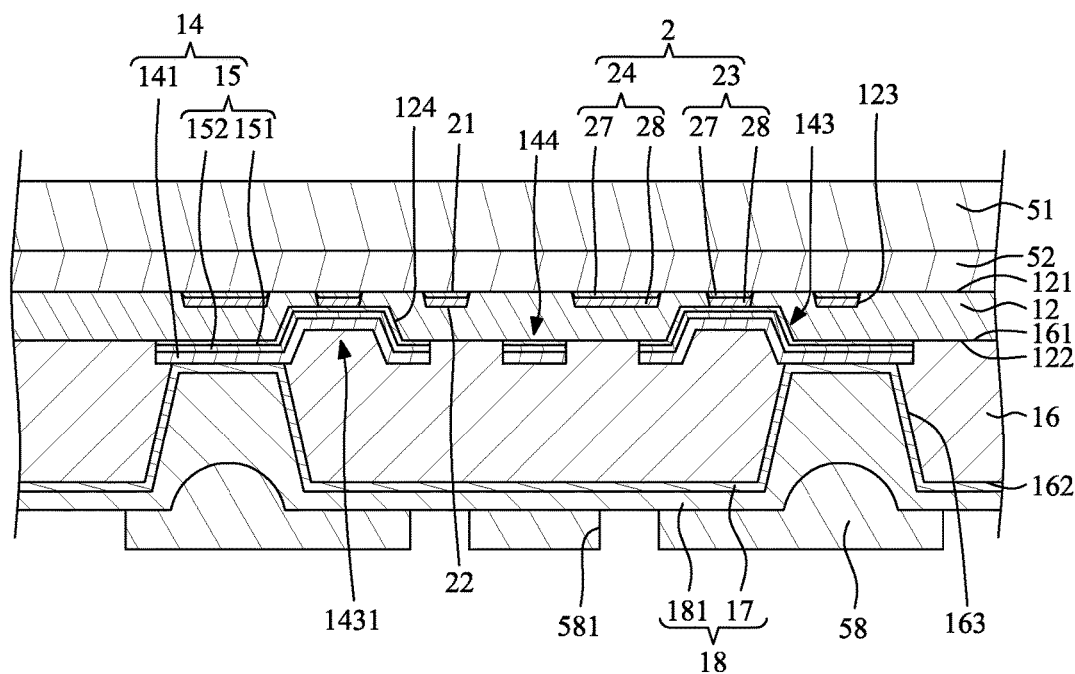
FIG. 30 illustrates one or more stages of some embodiments of a method for manufacturing a semiconductor device according to an aspect of the present disclosure.

Referring to FIG. 30, a plurality of openings 581 are formed in the photoresist layer 58 by, for example, lithographic patterning process, to expose portions of the third metal layer 181.

Figure 31:
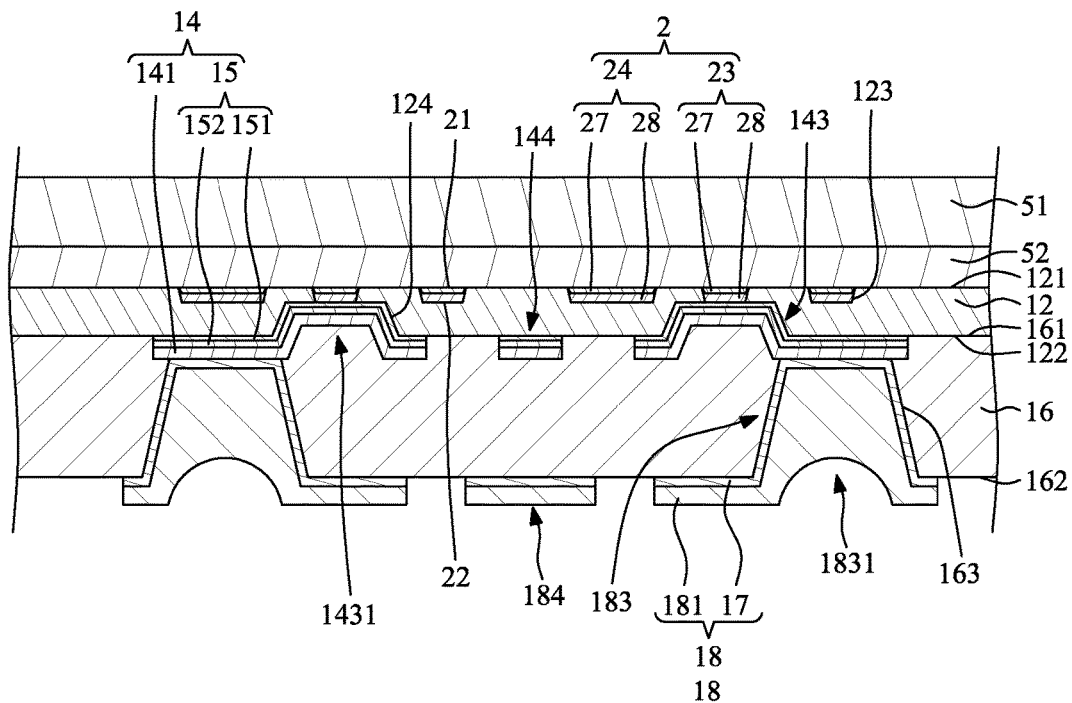
FIG. 31 illustrates one or more stages of some embodiments of a method for manufacturing a semiconductor device according to an aspect of the present disclosure.

Referring to FIG. 31, portions of the third seed layer 17 and the third metal layer 181 that are exposed in the openings 581 are removed by, for example, etching. The photoresist layer 58 is removed by, for example, stripping. Meanwhile, a third circuit layer 18 is formed or disposed on the second dielectric structure 16. In some embodiments, a portion of the third circuit layer 18 is formed or disposed in the opening(s) 163 of the second dielectric structure 16 so to form at least one third conductive via 183, and the other portion of the third circuit layer 18 is disposed on the second surface 162 of the second dielectric structure 16 so as to form a third patterned layer 184 which may include at least one conductive trace and/or at least one bonding pad. The third conductive via 183 is electrically connected to and contacts the second circuit layer 14. Thus, the third circuit layer 18 is electrically connected to the second circuit layer 14 through the third conductive via(s) 183.

The third conductive via 183 may be a tapered structure that is tapered from the second surface 162 of the second dielectric structure 16 toward the first surface 161 of the second dielectric structure 16. The third conductive via 183 may define a recess portion 1831 at a bottom end thereof. The third conductive via(s) 183 and the third patterned layer 184 may be formed integrally and concurrently. An L/S of the third circuit layer 18 may be greater than, for example, about 5 μm/about 5 μm, about 7 μm/about 7 μm, or about 10 μm/about 10 μm. The L/S of the third circuit layer 18 may be greater than the L/S of the second circuit layer 14. As shown in FIG. 31, the third circuit layer 18 includes a third seed layer 17 and a third metal layer 181. It is noted that the third conductive via(s) 183 may include at least a portion of the third seed layer 17 and the third metal layer 181, and the third patterned layer 184 may also include at least a portion of the third seed layer 17 and the third metal layer 181.

Figure 32:
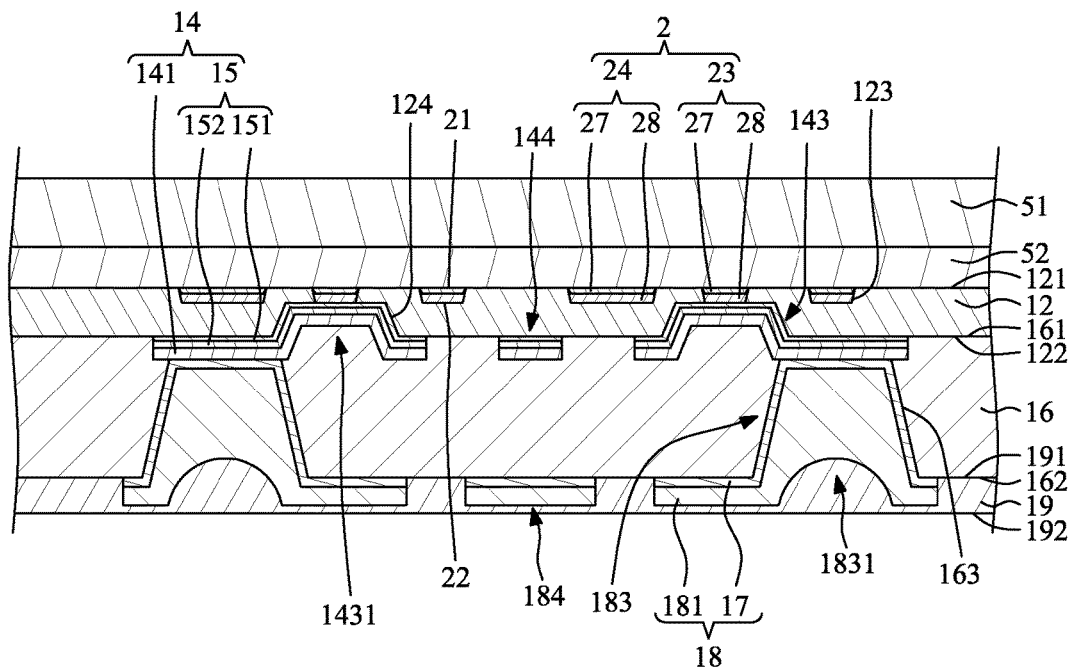
FIG. 32 illustrates one or more stages of some embodiments of a method for manufacturing a semiconductor device according to an aspect of the present disclosure.

Referring to FIG. 32, a third dielectric structure 19 is formed or disposed to cover the third circuit layer 18 and the second surface 162 of the second dielectric structure 16 by, for example, coating. The third dielectric structure 19 includes a first surface 191 and a second surface 192 opposite to the first surface 191. The first surface 191 of the third dielectric structure 19 contacts the second surface 162 of the second dielectric structure 16 A portion of the third dielectric structure 19 extends into the recess portion(s) 1831 of the third conductive via(s) 183 of the third circuit layer 18.

Figure 33:
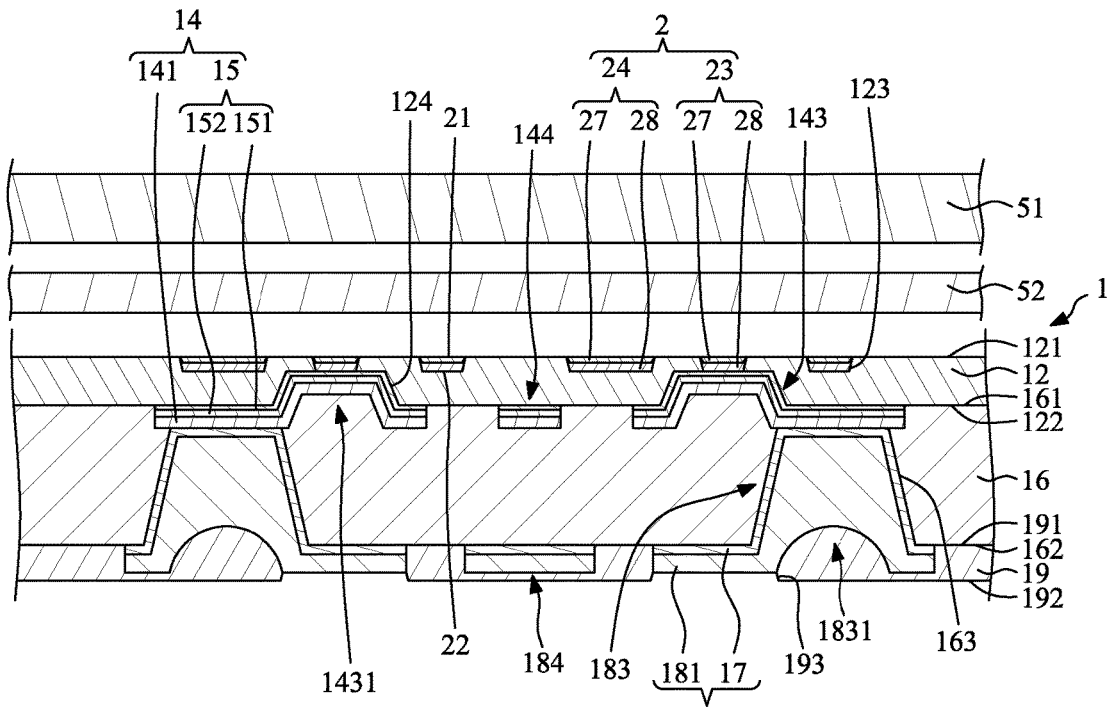
FIG. 33 illustrates one or more stages of some embodiments of a method for manufacturing a semiconductor device according to an aspect of the present disclosure.

Referring to FIG. 33, a plurality of openings 193 are formed in the third dielectric structure 19 to expose portions of the third circuit layer 18 (e.g., portions corresponding to the third metal layer 181). Then, the first outermost layer 51 and the intermediate layer 52 are removed to expose the first circuit layer 2. Meanwhile, the semiconductor substrate 1 of FIGS. 1-3 is obtained.

Figure 34:
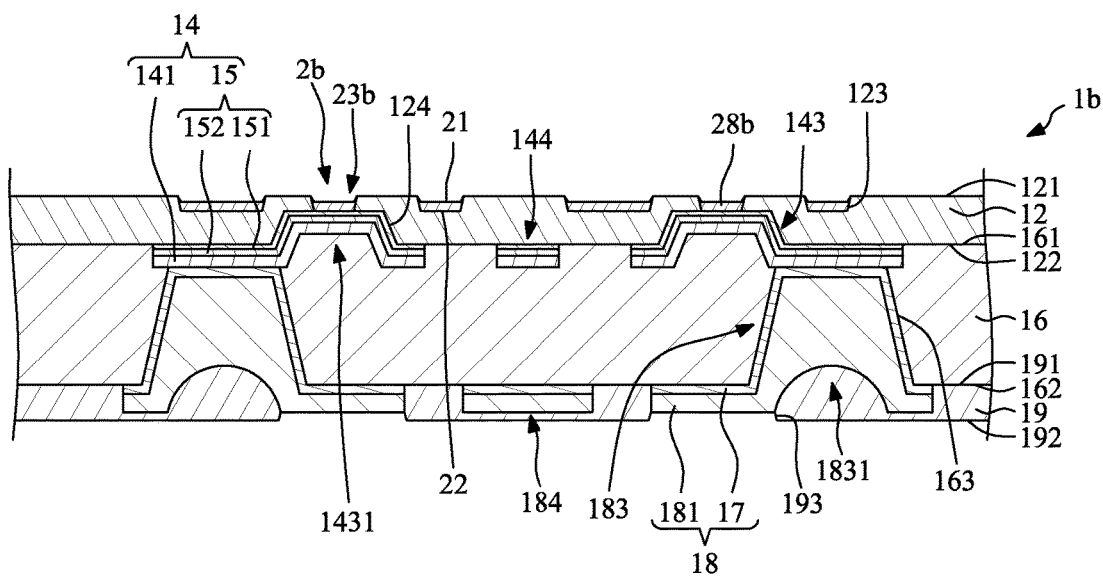
FIG. 34 illustrates one or more stages of some embodiments of a method for manufacturing a semiconductor device according to an aspect of the present disclosure.

Referring to FIG. 34, in some embodiments, the first metal structure 27 may be further removed, so as to obtain the semiconductor substrate 1b. A portion of a first circuit layer 2b of the semiconductor substrate 1b is shown in FIG. 5. The conductive segment (e.g., the conductive trace 23b and/or the bonding pad) of the first circuit layer 2b includes a second metal structure 28b which may be copper (Cu). That is, in FIG. 5, the second metal structure 28b may be a single layer, and may not fill or may fill a portion of the recess portions 123 of the first dielectric structure 12.

Figure 35:
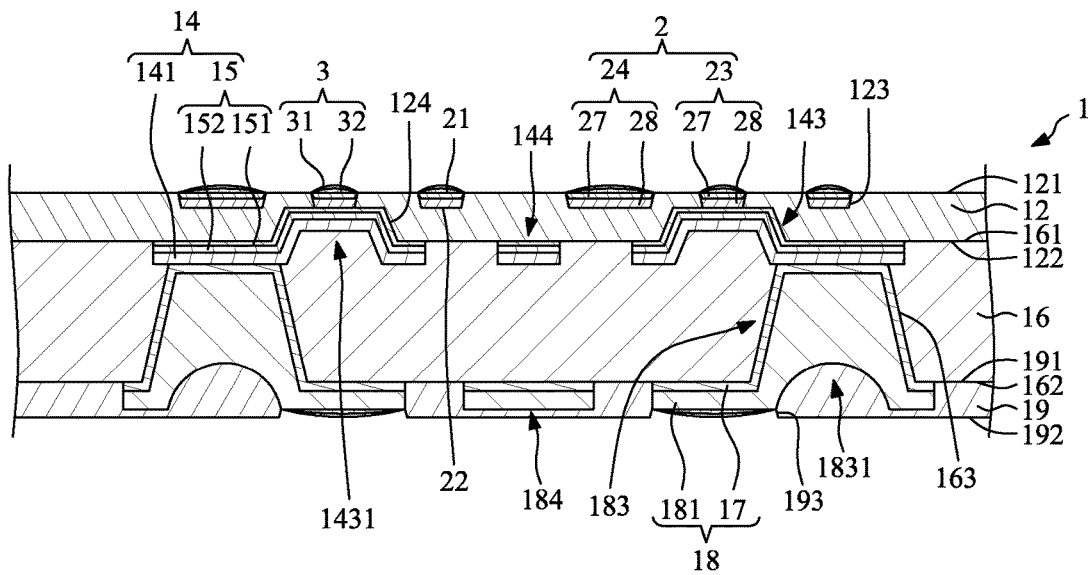
FIG. 35 illustrates one or more stages of some embodiments of a method for manufacturing a semiconductor device according to an aspect of the present disclosure.

Referring to FIG. 35, a barrier layer 3 is formed or disposed on the conductive segment (e.g., the conductive trace 23 and/or the bonding pad 24) of the first circuit layer 2 of FIG. 33. In some embodiments, the barrier layer 3 includes a nickel layer 31 and a gold layer 32. The nickel layer 31 is disposed on the conductive segment (e.g., the conductive trace 23 and the bonding pad 24), and the gold layer 32 is disposed on the nickel layer 31. In some embodiments, the barrier layer 3 may be further disposed on the exposed portions of the third circuit layer 18 (e.g., portions corresponding to the third metal layer 181) in the openings 193 of the third dielectric structure 19.

Figure 36:
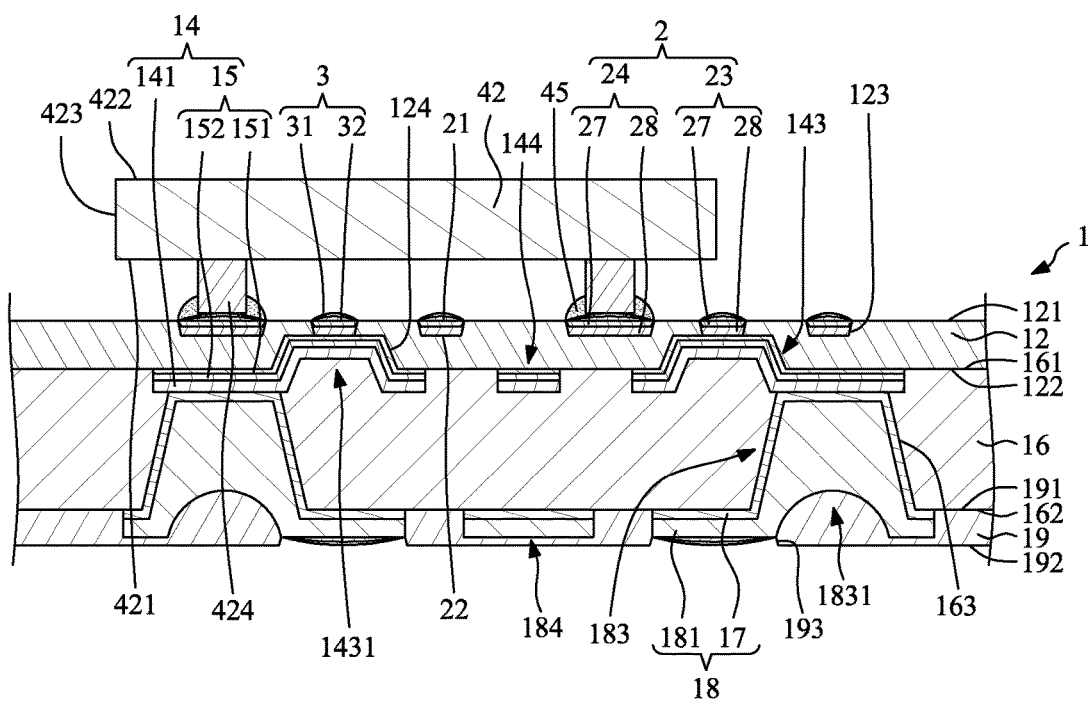
FIG. 36 illustrates one or more stages of some embodiments of a method for manufacturing a semiconductor device according to an aspect of the present disclosure.

Referring to FIG. 36, a semiconductor die 42 is attached to the semiconductor substrate 1 and electrically connected to the first circuit layer 2. The semiconductor die 42 has an active surface 421, a backside surface 422, a lateral surface 423 and a plurality of conductive bumps 424. The backside surface 422 is opposite to the active surface 421. The lateral surface 423 extends between the active surface 421 and the backside surface 422. The conductive bumps 424 are disposed adjacent to the active surface 421. The conductive bump 424 contacts the nickel layer 31 of the barrier layer 3 on the conductive segment (e.g., the bonding pad 24) of the first circuit layer 2. Thus, the semiconductor die 42 is attached to the semiconductor substrate 1 by flip chip bonding. The semiconductor die 42 is electrically connected to the first circuit layer 2 of the semiconductor substrate 1 through the conductive bumps 424 and the barrier layer 3. In addition, a plurality of solders 45 are formed to cover the lower ends of the conductive bumps 424 and the barrier layer 3 to ensure the bonding between the conductive bumps 424 and the barrier layer 3.

Figure 37:
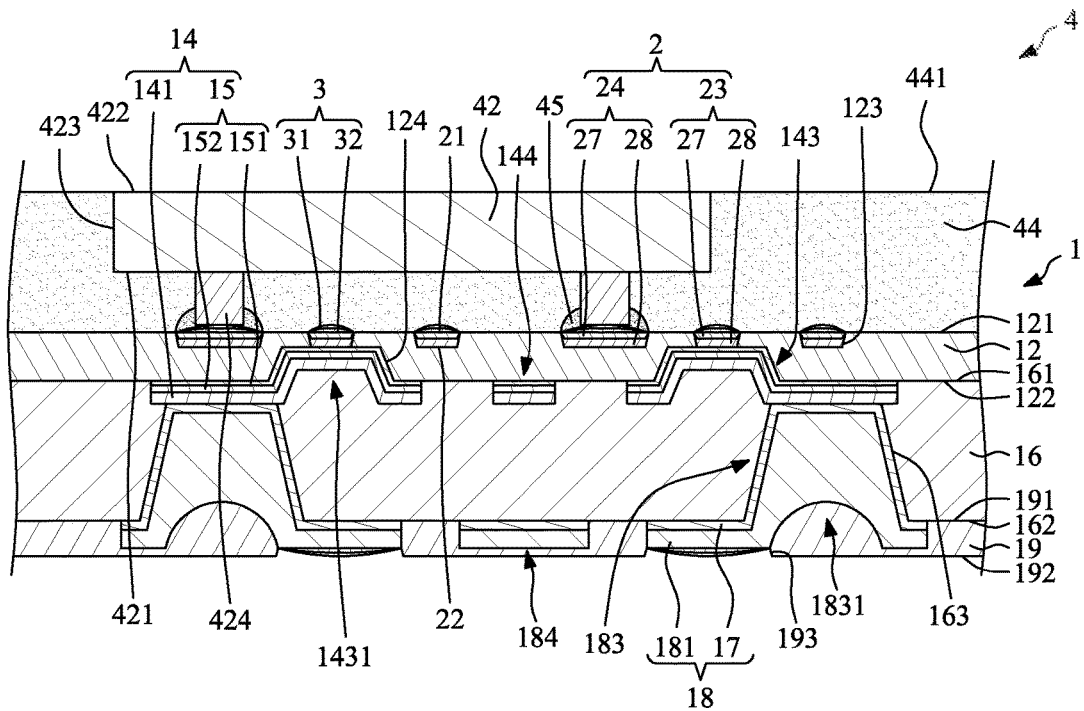
FIG. 37 illustrates one or more stages of some embodiments of a method for manufacturing a semiconductor device according to an aspect of the present disclosure.

Referring to FIG. 37, an encapsulant 44, for example, a molding compound, is formed or disposed to cover the semiconductor die 42 and the semiconductor substrate 1. The structure shown in FIG. 37 may include one or more semiconductor package structures 4 as shown in FIG. 8. In some embodiments, the encapsulant 44 covers the first surface 121 of the first dielectric structure 12, a portion (e.g., the upper ends) of the conductive bumps 424, the active surface 421 of the semiconductor die 42 and the lateral surface 423 of the semiconductor die 42. A first surface 441 of the encapsulant 44 may be substantially coplanar with the backside surface 422 of the semiconductor die 42. Thus, the backside surface 422 of the semiconductor die 42 is exposed from the first surface 441 of the encapsulant 44.

Figure 38:
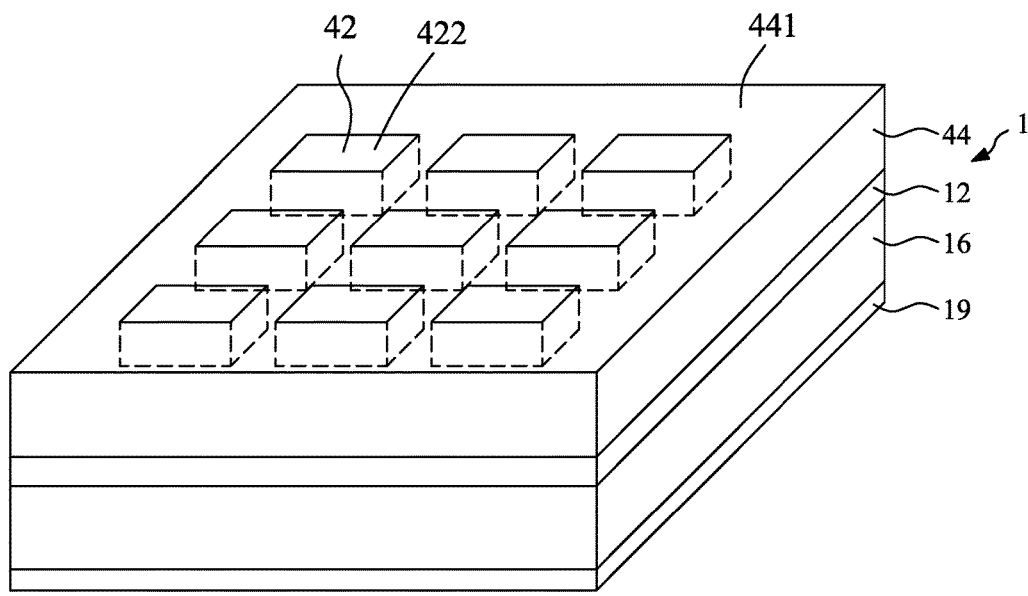
FIG. 38 illustrates one or more stages of some embodiments of a method for manufacturing a semiconductor device according to an aspect of the present disclosure.

Referring to FIG. 38, the shape of the semiconductor substrate 1 may be substantially rectangular or square.

Figure 39:
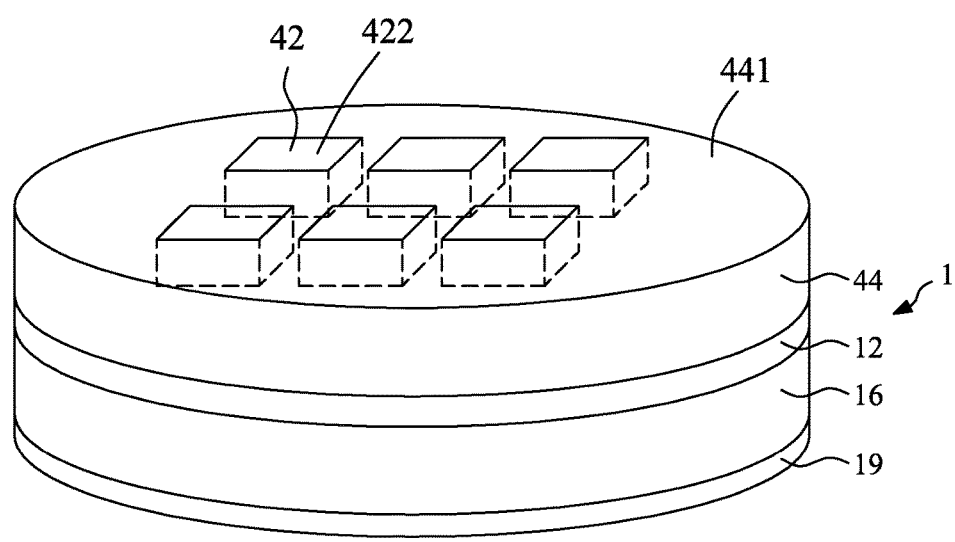
FIG. 39 illustrates one or more stages of some embodiments of a method for manufacturing a semiconductor device according to an aspect of the present disclosure.

Referring to FIG. 39, the shape of the semiconductor substrate 1 may be substantially circular or elliptical.

A plurality of external connectors 46 (e.g., solder bumps or solder balls) may be disposed in the respective ones of the openings 193 of the third dielectric structure 19 to contact the barrier layer 3 on the third circuit layer 18 for external connections. The encapsulant 44 and the semiconductor substrate 1 may be singulated to form a plurality of semiconductor package structures 4 as shown in FIG. 8.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Two surfaces can be deemed to be coplanar or substantially coplanar if a displacement between the two surfaces is no greater than 5 µm, no greater than 2 µm, no greater than 1 µm, no greater than 0.5 µm, or no greater than 0.1 µm. A surface can be deemed to be planar or substantially planar if a difference between a highest point and a lowest point of the surface is no greater than 5 µm, no greater than 2 µm, no greater than 1 µm, no greater than 0.5 µm, or no greater than 0.1 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate, comprising:
a first dielectric structure comprising a first surface and a second surface;
a first circuit layer embedded in the first dielectric structure, wherein the first circuit layer does not protrude from the first surface of the first dielectric structure, the first circuit layer includes at least one conductive segment including a trace, the conductive segment includes a first end adjacent to the first surface of the first dielectric structure and a second end opposite to the first end, and a width of the first end of the conductive segment is different from a width of the second end of the conductive segment; and
a second circuit layer disposed on the first circuit layer, the second circuit layer including at least one conductive via electrically connected to and contacting the conductive segment,
wherein the conductive segment is tapered from a first surface of the first circuit layer toward a second surface of the first circuit layer, and the conductive via is tapered from the second surface of the first dielectric structure toward the first surface of the first dielectric structure.

2. The semiconductor substrate according to claim 1, wherein an inclination angle between a side wall of the conductive segment and the first surface of the first dielectric structure is greater than 90 degrees.

3. The semiconductor substrate according to claim 1, wherein the width of the first end of the conductive segment is greater than the width of the second end of the conductive segment.

4. The semiconductor substrate according to claim 1, wherein a line width/line space (L/S) of the first circuit layer is less than or equal to 2 micrometers (μm)/2 μm.

5. The semiconductor substrate according to claim 1, wherein the first surface of the first circuit layer is substantially coplanar with the first surface of the first dielectric structure.

6. The semiconductor substrate according to claim 1, wherein the conductive segment of the first circuit layer is a monolithic structure, and a surface roughness value of a first surface of the first circuit layer is in a range of from 5 nanometers (nm) to 55 nm.

7. The semiconductor substrate according to claim 1, wherein the conductive segment of the first circuit layer includes a first metal structure and a second metal structure, the second metal structure is disposed on the first metal structure and further extends to cover and contacts at least a portion of a side surface of the first metal structure.

8. The semiconductor substrate according to claim 7, wherein a material of the first metal structure is titanium, and a material of the second metal structure is copper.

9. The semiconductor substrate according to claim 7, wherein a thickness of the first metal structure is greater than or equal to 0.1 μm, and a thickness of the second metal structure is greater than or equal to 0.2 μm.

10. The semiconductor substrate according to claim 1, further comprising a barrier layer disposed on the conductive segment, wherein the barrier layer includes a nickel layer and a gold layer, and the nickel layer is disposed between the gold layer and the conductive segment.

11. The semiconductor substrate according to claim 10, wherein a surface roughness value of a first surface of the nickel layer is in a range of from 200 nm to 300 nm, and a surface roughness value of a first surface of the gold layer is in a range of from 50 nm to 200 nm.

12. The semiconductor substrate according to claim 1, wherein the first end of the conductive segment defines a cavity, and a first surface of the first circuit layer is recessed from the first surface of the first dielectric structure.

13. The semiconductor substrate according to claim 12, wherein the cavity has a first portion adjacent to the first surface of the first dielectric structure and a second portion opposite to the first portion, and a width of the first portion of the cavity is greater than a width of the second portion of the cavity.

14. The semiconductor substrate according to claim 12, further comprising a barrier layer disposed in the cavity of the conductive segment, wherein the barrier layer includes a nickel layer and a gold layer, and the nickel layer is disposed between the gold layer and the conductive segment.

15. The semiconductor substrate according to claim 1, wherein a line width/line space (L/S) of the first circuit layer is less than or equal to 1 μm/1 μm.

16. The semiconductor substrate according to claim 1, wherein a line width/line space (L/S) of the second circuit layer is greater than a line width/line space (L/S) of the first circuit layer.

17. A semiconductor package structure, comprising:
a semiconductor substrate, comprising:
a first dielectric structure comprising a first surface and a second surface;
a first circuit layer embedded in the first dielectric structure, wherein the first circuit layer does not protrude from the first surface of the first dielectric structure, the first circuit layer includes at least one conductive segment including a trace, the conductive segment includes a first end adjacent to the first surface of the first dielectric structure and a second end opposite to the first end, and a width of the first end of the conductive segment is different from a width of the second end of the conductive segment, wherein a line width/line space (L/S) of the first circuit layer is less than or equal to 2 μm/2 μm; and
a second circuit layer disposed on the first circuit layer, the second circuit layer including at least one conductive via electrically connected to and contacting the conductive segment; and
a semiconductor die attached to the semiconductor substrate and electrically connected to the first circuit layer,
wherein the conductive segment is tapered from a first surface of the first circuit layer toward a second surface of the first circuit layer, and the conductive via is tapered from the second surface of the first dielectric structure toward the first surface of the first dielectric structure.

18. The semiconductor package structure according to claim 17, wherein an inclination angle between a side wall of the conductive segment and the first surface of the first dielectric structure is greater than 90 degrees.

19. The semiconductor package structure according to claim 17, further comprising an encapsulant covering the semiconductor die and the semiconductor substrate.

20. The semiconductor package structure according to claim 17, wherein the width of the first end of the conductive segment is greater than the width of the second end of the conductive segment.

21. The semiconductor package structure according to claim 17, wherein the first surface of the first circuit layer is substantially coplanar with the first surface of the first dielectric structure.

22. The semiconductor package structure according to claim 17, wherein the first end of the conductive segment defines a cavity, and a first surface of the first circuit layer is recessed from the first surface of the first dielectric structure.

23. The semiconductor package structure according to claim 17, wherein a surface roughness value of the first surface of the first circuit layer is in a range of from 5 nm to 55 nm.

* * * * *